United States Patent [19]
Noble

[11] Patent Number: 5,976,930
[45] Date of Patent: Nov. 2, 1999

[54] METHOD FOR FORMING GATE SEGMENTS FOR AN INTEGRATED CIRCUIT

[75] Inventor: Wendell P. Noble, Milton, Vt.

[73] Assignee: Micron Technology, Inc., Boise, Id.

[21] Appl. No.: 08/842,971

[22] Filed: Apr. 25, 1997

[51] Int. Cl.[6] .............................................. H01L 21/8242
[52] U.S. Cl. ........................................ 438/253; 438/254
[58] Field of Search ................................... 438/238, 239, 438/253–256, 381, 396–399

[56] References Cited

U.S. PATENT DOCUMENTS

| | | | |
|---|---|---|---|
| 4,604,162 | 8/1986 | Sobczak .................................. 156/657 |
| 5,214,603 | 5/1993 | Dhong et al. ........................... 365/207 |
| 5,391,911 | 2/1995 | Beyer et al. ............................. 257/522 |
| 5,539,229 | 7/1996 | Noble et al. ............................. 257/301 |

FOREIGN PATENT DOCUMENTS 0720221  7/1996  European Pat. Off. .... H01L 21/8242

OTHER PUBLICATIONS

Bakeman, P., et al., "A High Performance 16–Mb DRAM Technology", *1990 Symposium on VLSI Technology, Digest of Technical Papers*, Honolulu, Hawaii, 11–12, (Jun. 4–7, 1990).

Davari, B., et al., "A Variable–Size Shallow Trench Isolation (STI) Technology with Diffused Sidewall Doping for Sub-micron CMOS", *iedm Technical Digest*, International Electron Devices Meeting, San Francisco, CA, 92–95, (Dec. 11–14, 1998).

Kohyama, Y., et al., "Buried Bit–Line Cell for 64MB DRAMs", *1990 Symposium on VLSI Technology, Digest of Technical Papers*, Honolulu, HI, 17–18, (June 4–7, 1990).

Kuge, S., et al., "SOI–DRAM Circuit Technologies for Low Power High Speed Multigiga Scale Memories", *IEEE Journal of Solid–State Circuits*, 31, 586–591, (Apr., 1996).

Suma, K., et al., "An SOI–DRAM with Wide Operating Voltage Range by CMOS/SIMOX Technology", *IEEE Journal of Solid–State Circuits*, 29, 1323–1329, (Nov. 1994).

*Primary Examiner*—Joni Chang
*Attorney, Agent, or Firm*—Schwegman, Lundberg Woessner & Kluth P.A.

[57] ABSTRACT

A method for forming gate segments in an integrated circuit. The method begins by forming a shallow trench isolation region outwardly from a layer of semiconductor material to isolate a plurality of active regions of the integrated circuit. After the isolation region is formed, at least one gate segment is formed in each active region by depositing, planarizing and selectively etching a conductive material. Source/drain regions are also formed in the active region. The active regions are selectively interconnected with edge-defined conductors that pass outwardly from the gate segments and the shallow trench isolation region to form the integrated circuit.

9 Claims, 21 Drawing Sheets

5,976,930

METHOD FOR FORMING GATE SEGMENTS FOR AN INTEGRATED CIRCUIT

CROSS REFERENCE TO RELATED CASES

This application is related to commonly assigned patent application Ser. No. 08/842,950 (Attorney docket no. 303.256US1) and patent application Ser. No. 08/845,609 (Attorney docket no. 660073.550), filed Apr. 25, 1997, now U.S. Pat. No. 5,892,707.

TECHNICAL FIELD OF THE INVENTION

The present invention relates generally to the field of integrated circuits and, in particular, to a method for forming gate segments for an integrated circuit.

BACKGROUND OF THE INVENTION

In the integrated circuit industry, designers continuously try to put more circuitry onto a given surface area of semiconductor material. The goal is to provide integrated circuits that can perform more functions without increasing the size of the circuit. To do this, designers develop techniques to pack the elements of the circuits closer together on the semiconductor material. Thus from generation to generation, an integrated circuit has a higher density of circuit elements and can perform more sophisticated functions. This can readily be observed in the case of microprocessors for personal computers.

In many instances, this increase in density follows well defined trends. For example, in the area of memory devices, the size of the cells that store the data for the memory device decrease by approximately one-third in each successive generation. Many factors contribute to this trend. For example, semiconductor processing typically uses lithographic techniques. These techniques impose a minimum dimension for creating circuit elements that is referred to as the minimum "lithographic dimension." By creating improvements in the tooling used for the lithography, designers continuously improve the minimum lithographic dimension. This follows a well defined pattern such that the minimum lithographic dimension for the next generation of memory devices can be predicted with some degree of accuracy. Other factors also contribute to the trend in the size of these memory cells.

At present, designers are working on ways to produce high density dynamic random access memory devices (DRAMs) in the gigabyte range. To stay on course with the traditional industry trend, each cell of the next generation memory device will be on the order of 0.25 $\mu m^2$ with a minimum lithographic dimension of approximately 0.18 $\mu m$. One conventional layout for a DRAM device is referred to as a folded bit line layout. Each cell in the folded bit line layout requires 8 "features." A feature is traditionally one-half of the dimension of a word or bit line "pitch." The term "pitch refers to the line plus required spacing. This feature size limitation dictates that a folded bit line layout requires a minimum of 8 feature sizes. It can be seen that decreases in the minimum dimension alone will not allow the cell size to continue to follow these well defined industry trends.

Designers have created a partial solution to this problem. They have replaced traditional word lines with sub-lithographic word lines that are formed outwardly from segmented gates regions of access transistors in each cell. The dimension of the word line that is normal to the surface of the substrate is greater than the width of the word line. One problem with this technique involves formation of the gate segments.

U.S. Pat. No. 5,539,229, entitled "MOSFET with Raised STI Isolation Self-Aligned to the Gate Stack" describes a gate oxide and conductor layer that are formed prior to formation of the shallow trench isolation that separates the cells of the memory device. The gate areas are formed next by removing portions of the conductor layer that cover the source and drain regions of the cell. The disadvantage of this technique is that the gate oxide and surface doping implant profiles are exposed to the mechanical and thermal processing associated with forming the shallow trench isolation.

For the reasons stated above, and for other reasons stated below which will become apparent to those skilled in the art upon reading and understanding the present specification, there is a need in the art for a method for forming gate segments for an integrated circuit without inadvertently affecting the doping implant profiles of the transistors or the gate oxide.

SUMMARY OF THE INVENTION

The above mentioned problems with forming gate segments for an integrated circuit and other problems are addressed by the present invention and which will be understood by reading and studying the following specification. A method for forming gate segments for an integrated circuit is described in which the gate segments are formed after the shallow trench isolation so as to avoid exposing the source/drain implants and gate oxide to the chemical/mechanical processes associated with formation of the shallow trench isolation. Further, by forming the shallow trench isolation regions first, the gate segments are self-aligned to the active regions.

In particular, an illustrative embodiment of the present invention includes forming a shallow trench isolation region outwardly from a layer of semiconductor material to isolate a plurality of active regions of the integrated circuit. After the isolation region is formed, at least one gate segment is formed in each active region. Source/drain regions are also formed in the active region. The active regions are selectively interconnected with edge-defined conductors that pass outwardly from the gate segments and the shallow trench isolation region to form the integrated circuit.

BRIEF DESCRIPTION OF THE DRAWINGS

FIGS. 3 through 17 are cross section and top views of an integrated circuit that illustrate one embodiment of a method for coupling to a semiconductor device in the integrated circuit having sub-lithographic, edge-defined word lines. Specifically, FIGS. 3, 5, 6A, and 7A through 17 are cross-sectional views of the integrated circuit throughout the illustrated embodiment.

DETAILED DESCRIPTION OF THE INVENTION

In the following detailed description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Formation of Gate Segments

FIGS. 1A through 1F are perspective views of a portion of an integrated circuit, indicated generally at 10, that illustrate an embodiment of a method for forming integrated circuit 10 according to the present invention. In the illustrated embodiment, integrated circuit 10 comprises a memory device with an array of storage cells having segmented gates that are self-aligned to shallow trench isolation regions. Specifically, the array of storage cells produced by this method can advantageously be used in a dynamic random access memory (DRAM) device with a shared, or folded, bit line structure. However, the teachings of the present invention are not limited to DRAM applications. The segmented, self-aligned gates can be used in other appropriate applications that call for conductors with a pitch that is less than the minimum lithographic dimension. These conductors are referred to as "sub-lithographic" conductors.

Figure 1A:
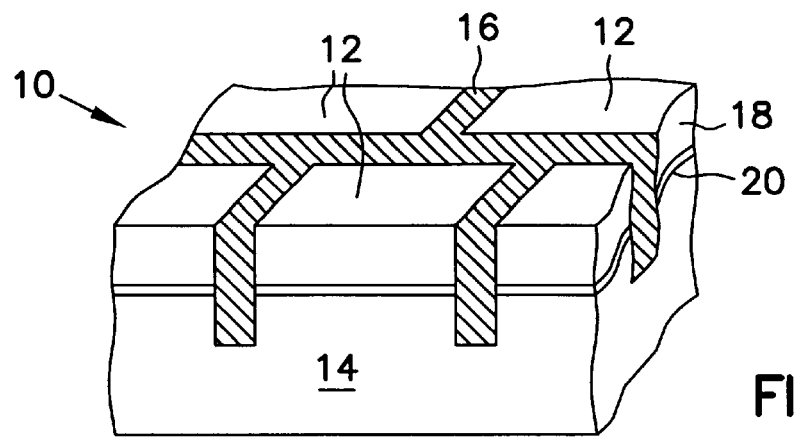
FIGS. 1A through 1F are perspective views of a portion of an integrated circuit that illustrate an embodiment of a method for forming the integrated circuit with self-aligned gate segments.

Referring to FIG. 1A, a number of active regions 12 are established for layer of semiconductor material 14 by shallow trench isolation region 16. The method produces two cells for memory device 10 in each active region 12. Shallow trench isolation region 16 is formed by first etching a trench through nitride layer ("pad") 18, oxide layer 20 and into layer of semiconductor material 14. The trench is over-filled with, for example, an oxide in a chemical vapor deposition (CVD) process. Shallow trench isolation region 16 is completed by polishing a working surface of the oxide back to a surface of nitride layer 18 using, for example, an appropriate planarization technique such as chemical mechanical planarization.

Figure 1B:
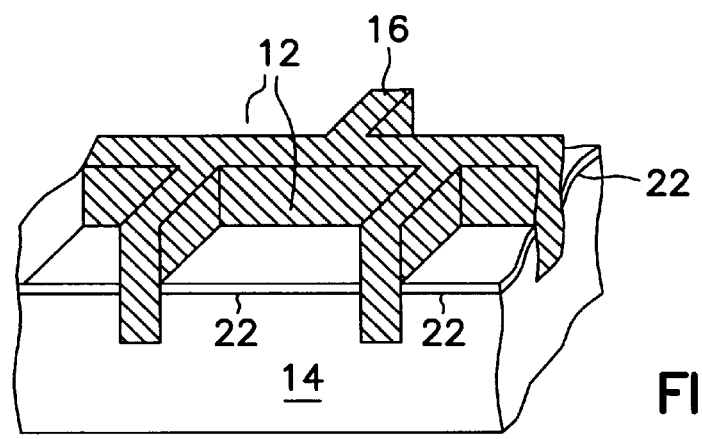
Figure 1C:
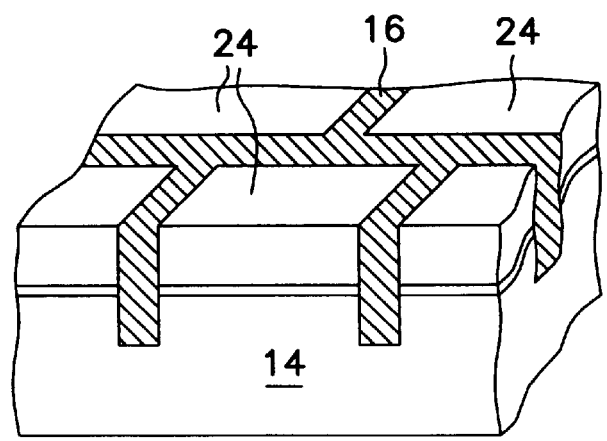

Referring to FIG. 1B, nitride layer 18 and oxide layer 20 are removed from layer of semiconductor material 14. This leaves a portion of shallow trench isolation region 16 extending outwardly from layer of semiconductor material 14 and surrounding and isolating active regions 12. This portion of shallow trench isolation region 16 is used to align the gate segments and confine the gate segments to active regions 12. Next, gate oxide layer 22 is formed in active regions 12 by, for example, growing a layer of silicon dioxide outwardly from layer of semiconductor material 14. Conductive layer 24 is formed outwardly from gate oxide layer 22 and covers active regions 12 and shallow trench isolation region 16. Conductive layer 24 typically comprises poly-silicon that is deposited using a chemical vapor deposition technique. A chemical/mechanical polish method is used to planarize the poly-silicon of conductive layer 24 to the level of the shallow trench isolation region 16, leaving poly-silicon in active regions 12 as shown in FIG. 1C.

Figure 1D:
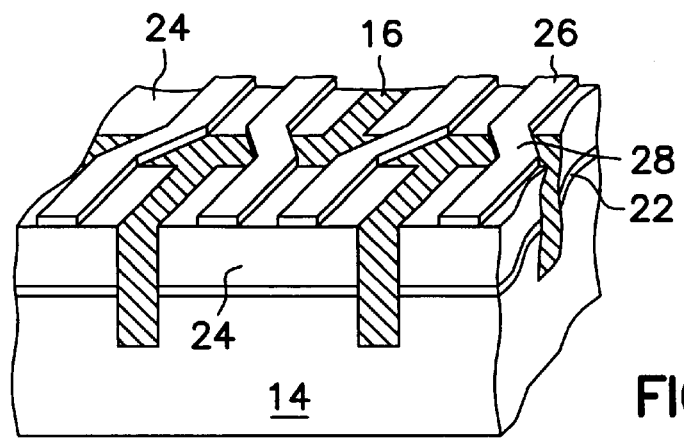

Referring to FIG. 1D, the method next defines the position of the gate segments. Photoresist layer 26 is deposited outwardly from shallow trench isolation region 16 and conductive layer 24. Photoresist layer 26 is exposed to produce, for example, a conventional word line pattern as shown. In a conventional application, the word line pattern is used to simultaneously form the gates of the access devices and the interconnections between gates of adjacent devices in the memory array. In this embodiment, a portion of the remaining photoresist layer 26 passes over shallow trench isolation region 16 as indicated at 28, for example.

Figure 1E:
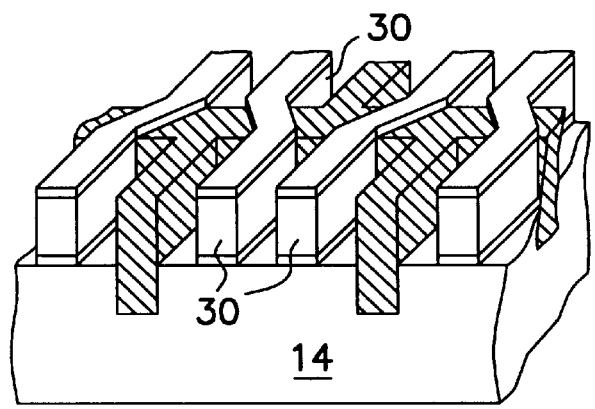
Figure 1F:
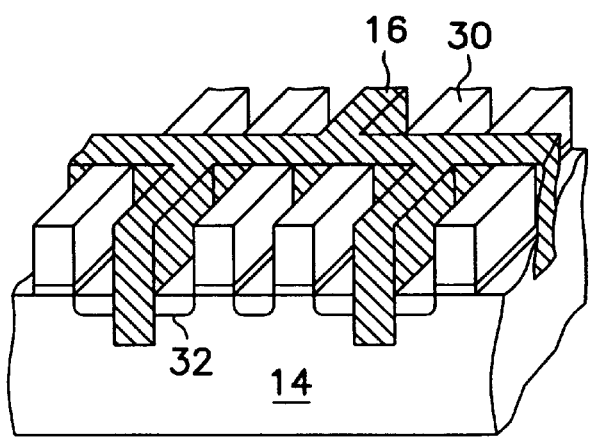

Referring to FIG. 1E, portions of conductive layer 24 are selectively removed to form two gate segments 30 in each active region 12. Photoresist layer 26 and exposed portions of gate oxide layer 22 are removed as shown in FIG. 1F. Thus, the method produces gate segments 30 that are self-aligned by shallow trench isolation region 16. Once gate segments 30 are formed, source/drain regions 32 are formed by, for example, ion implantation in layer of semiconductor material 14.

Formation of Sub-Lithographic Word Lines

Figure 2A:
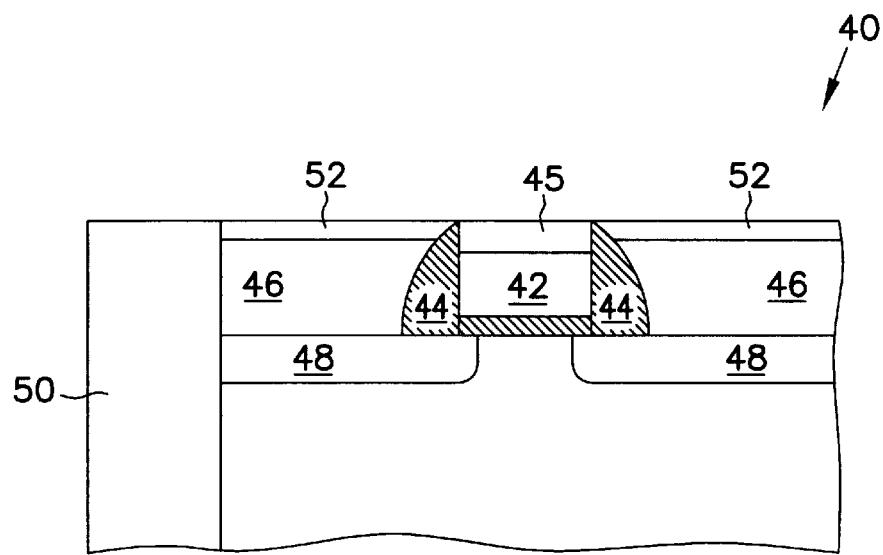
FIGS. 2A and 2B are cross sectional views of an integrated circuit that illustrate an embodiment of a method for forming sub-lithographic word lines.
Figure 2B:
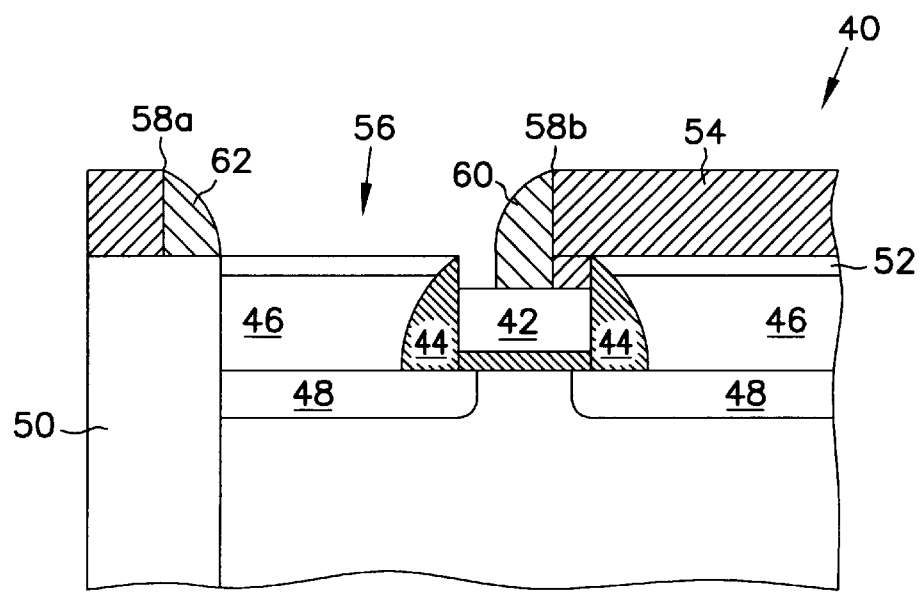

FIGS. 2A and 2B are cross sectional views of an integrated circuit, indicated generally at 40, that illustrate an embodiment for forming sub-lithographic word lines. These word lines can be used, for example, to interconnect gate segments 30 of FIG. 1F to form an array for a memory device. Such sub-lithographic word lines have widths that are less than the minimum feature size of the process, and thus allow such memory arrays to be constructed with folded-digit-line architecture without the word lines being electrically shorted together. Of course, such reduced-area memory arrays can be constructed with a shared-digit-line architecture using conventional process technology to form conventional word lines. Thus, the techniques shown in FIGS. 2A and 2B are not required to form a shared-digit-line architecture.

Referring to FIG. 2A, integrated circuit 40 includes gate segment 42 that is formed, for example, according to the technique described above with respect to FIG. 5 1A through 1F. Gate segment 42 is capped with, for example, nitride pad layer 45. Insulative sidewalls 44 are formed adjacent to the exposed vertical sidewalls of gate segment 42 using conventional techniques. For example, a layer of silicon dioxide is deposited using a chemical vapor deposition (CVD) process on exposed surfaces. The layer is then anisotropically etched to form insulative sidewalls 44. Conductive material is deposited adjacent to the sidewalls to form contacts 46 for source/drain regions 48 and is conventionally polished back to the exposed surface of trench isolation regions 50 and pad layer 45. Contacts 46 are further etched back so as to become recessed with respect to the surface pad layer 45. Next, insulator layer 52, such as an oxide, is conventionally grown or deposited and then polished back to the surface of trench isolation region 50 and pad layer 45 to give the structure shown in FIG. 2A.

Referring to FIG. 2B, mandrel 54 is conventionally formed on layer 52 and pad layer 45. In one embodiment, mandrel 54 is formed from intrinsic (undoped), poly-silicon. Mandrel 54 is then polished to smooth its upper surface. Next, groove 56 is etched in mandrel 54 to expose sidewalls 58a and 58b in mandrel 54. Sidewall 58a is over trench isolation region 50, and sidewall 58b is over gate segment 42. An anisotropic etch removes the exposed portion of pad layer 45 and thus exposes a region of gate 42. A conductive material such as poly-silicon is formed in groove 56. The conductive material is anisotropically etched to leave conductive sidewalls that become sub-lithographic word lines 60 and 62. In one embodiment, mandrel 54 is then removed. In another embodiment, mandrel 54 and word lines 60 and 62 are polished or etched to make the shape of word lines 60 and 62 more rectangular, and to center word line 60 over gate 42.

Formation of Stacked Capacitors

Figure 3:
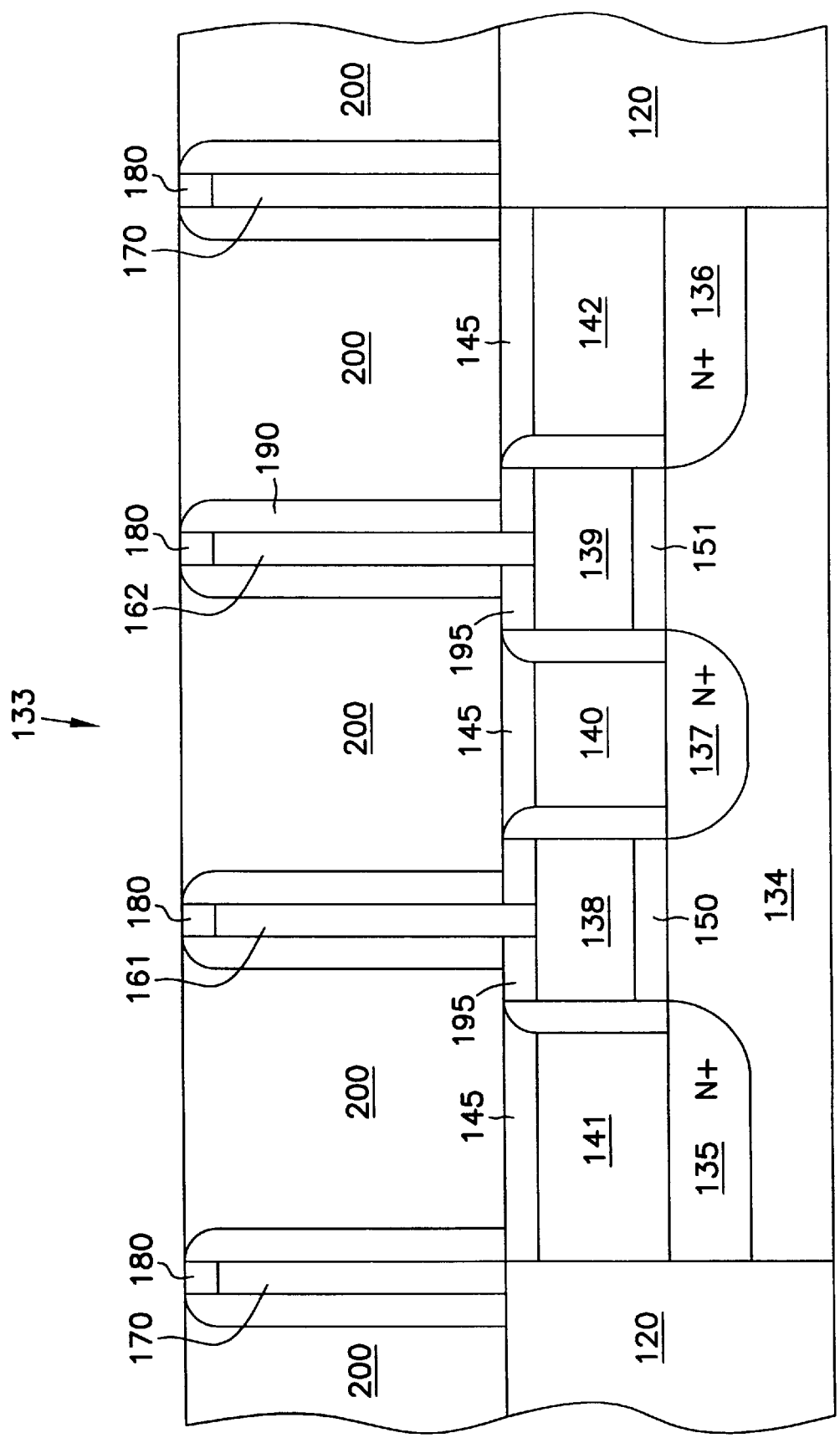

FIGS. 3 through 17 are cross section and plan views of an integrated circuit that show one embodiment of a method for forming stacked capacitors in a reduced-area memory array wherein the memory array has sub-lithographic, edge-defined word lines formed, for example, as described above with respect to FIGS. 2A and 2B. FIG. 3 illustrates one embodiment of an integrated circuit in which memory cells share a bit line. This embodiment is shown by way of example and is not a limitation of the present invention. Alternate embodiments exist, such as a conventional memory cell having its own bit line, and are within the scope of the present invention.

Referring to FIG. 3, silicon substrate 134 provides a strong base for the semiconductor layers of integrated circuit 133. The term substrate refers to the base semiconductor layer or layers or structures of an integrated circuit which includes active or operable portions of semiconductor devices. In addition shallow trench isolation 120 provides support and isolation between the devices in integrated circuit 133.

N+ diffusion regions 135, 136, and 137 are formed in substrate 134 by introducing any suitable N-type dopant into substrate 134. The N-type dopant, such as phosphorus, is typically introduced by diffusion or ion implantation. Device gates 138 and 139 typically comprise poly-silicon and are separated from substrate 134 by thin layers of oxide 150 and 151 respectively in order to limit the gate current to a negligible amount. In this configuration, N+ diffusion region 135, device gate 138, substrate 134, and N+ diffusion region 137 define a first transistor. Similarly, N+ diffusion region 136, device gate 139, silicon substrate 134, and N+ diffusion region 137 defame a second transistor. The transistors are shown as exemplary only, in an alternate embodiment, any suitable semiconductor device may be formed in substrate 134 without departing from the scope of the present invention.

The center N+ diffusion region 137 acts as a common source or drain while the N+ diffusion regions 135 and 136 act as independent sources or drains depending upon the voltage applied to the regions. In one embodiment, the transistors are essentially enhanced n-channel MOS transistors. Alternatively, any transistor configuration suitable for memory cell access may readily be used.

Integrated circuit 133 comprises contact regions which can be any appropriate conductive material such as poly-silicon. These contact regions are coupled to the N+ diffusion regions. Contact region 140 is coupled to N+ diffusion region 137 while contact regions 141 and 142 are coupled with the N+ diffusion regions 135 and 136 respectively. The contact insulating layers 145 comprise a conventional thin film insulator such as silicon nitride, $Si_3N_4$ and insulate contact regions 140, 141, and 142.

Integrated circuit 133 comprises conductors 161 and 162 which extend normal to the substrate 134 and are formed outwardly from device gates 138 and 139. Conductors 161 and 162 are sub-lithographic, edge-defined word lines of a suitable conductor such as poly-silicon. In another embodiment, the edge-defined word lines comprise any suitable conductive material such as a conventional metal.

Sub-lithographic, edge-defined word lines 161 and 162 are formed outwardly from device gates 138 and 139 using semiconductor fabrication techniques as are known in the art. "Passing" conductors 170 form a second pair of conductors which provide a conductive path to adjacent memory cells in integrated circuit 133.

Figure 4A:
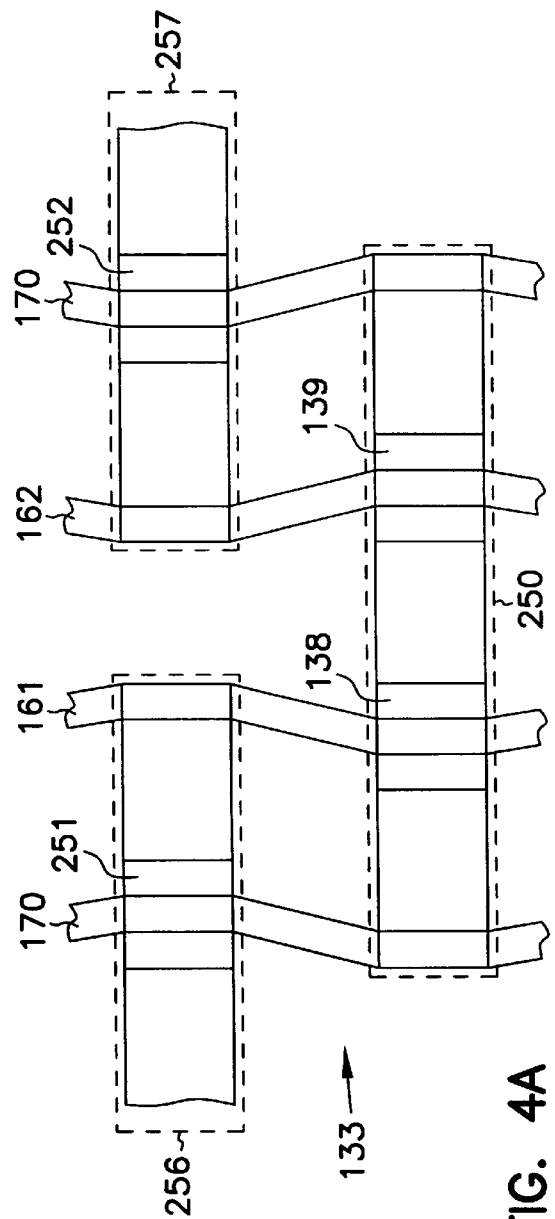
FIGS. 4A, 4B, and 6B are top views of the integrated circuit throughout the illustrated embodiment.

FIG. 4A, which is a top view of integrated circuit 133, illustrates the interconnection of the memory cells of integrated circuit 133. Specifically, FIG. 4A illustrates how conductors 161 and 162 are coupled with device gates 138 and 139 respectively within memory cell 250. FIG. 4A also illustrates how passing conductors 170 pass through memory cell 250 and are coupled to device gates 251 and 252 of adjacent memory cells 256 and 257. Note that memory cells 256 and 257 are only partially shown.

Referring again to FIG. 3, conductors 161 and 162 are capped with insulator 180 and are lined with insulator 190. Insulator 195 insulates device gates 138 and 139. Any suitable semiconductor insulator such as $SiO_2$ may be used for insulators 180, 190, or 195.

In order to form stacked capacitors outwardly from substrate 134 of integrated circuit 133, a material with a high degree of etch selectivity is used. The suitable material, such as intrinsic poly-silicon 200, is deposited between the conductors 161 and 162 and passing conductors 170 by a conventional process such as chemical-vapor deposition (CVD). As is well-known in the art, CVD is the process by which gases or vapors are chemically reacted, leading to the formation of a solid on a substrate. The high degree of etch selectivity of a material such as intrinsic poly-silicon is advantageous because it allows intricate etching without disturbing the surrounding semiconductor regions.

Figure 4B:
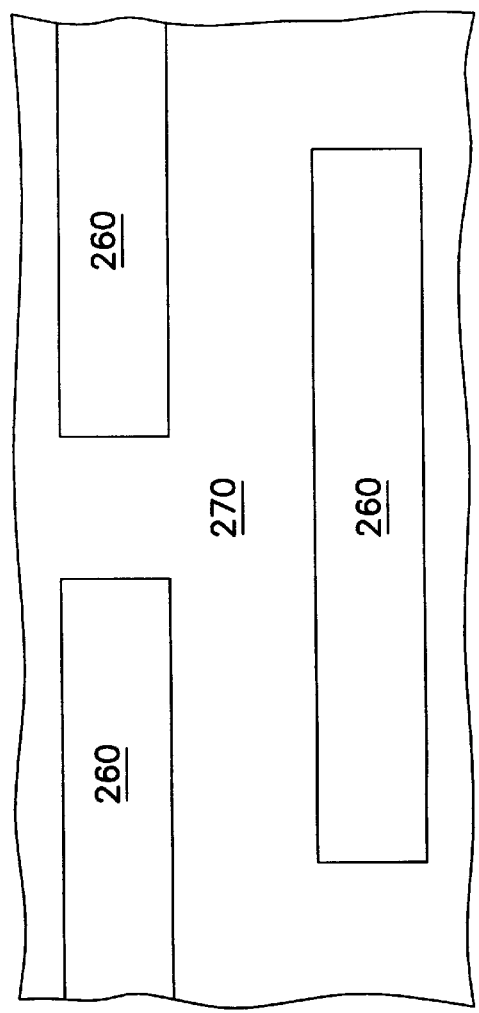

Next, a photoresist and a mask is used to reveal the plurality of semiconductor memory cells of substrate 134. FIG. 4B illustrates the layout of the mask. First, a photoresist is applied to the entire integrated circuit 133. Masked areas 260 illustrate the areas of photoresist 270 which are covered by a mask and therefore are not hardened when exposed to ultraviolet light.

Figure 5:
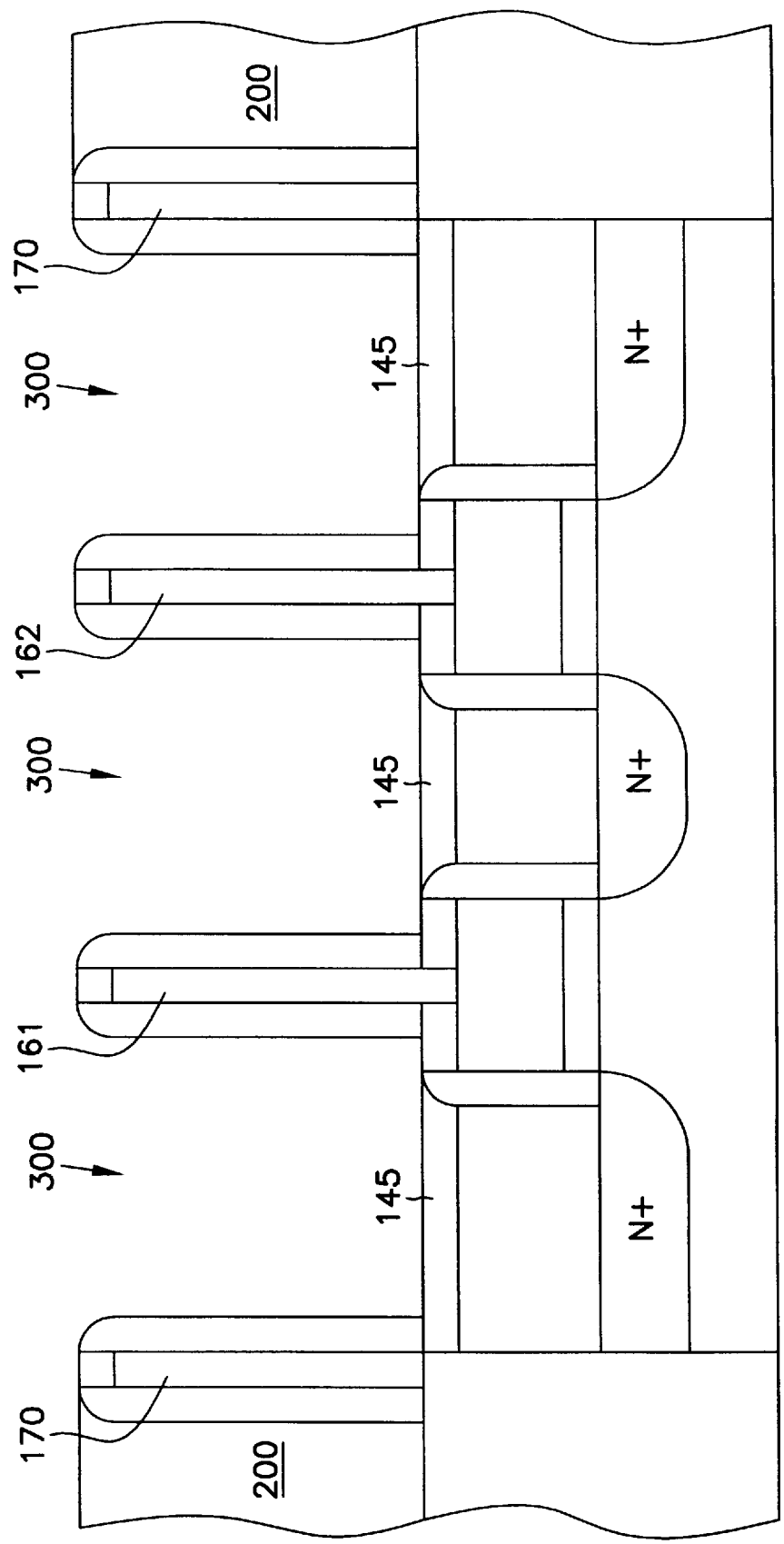

After exposing the resist and mask, the intrinsic poly-silicon 200 between conductors 161 and 162 and passing conductors 170 is removed by selectively etching the material. As illustrated in FIG. 5, three stud holes 300 are created in integrated circuit 133. Stud holes 300 extend into integrated circuit 133 toward substrate 134 and ultimately reveal contact insulating layers 145. The portions of the intrinsic poly-silicon 200 which are covered by the mask are not etched.

Figure 6A:
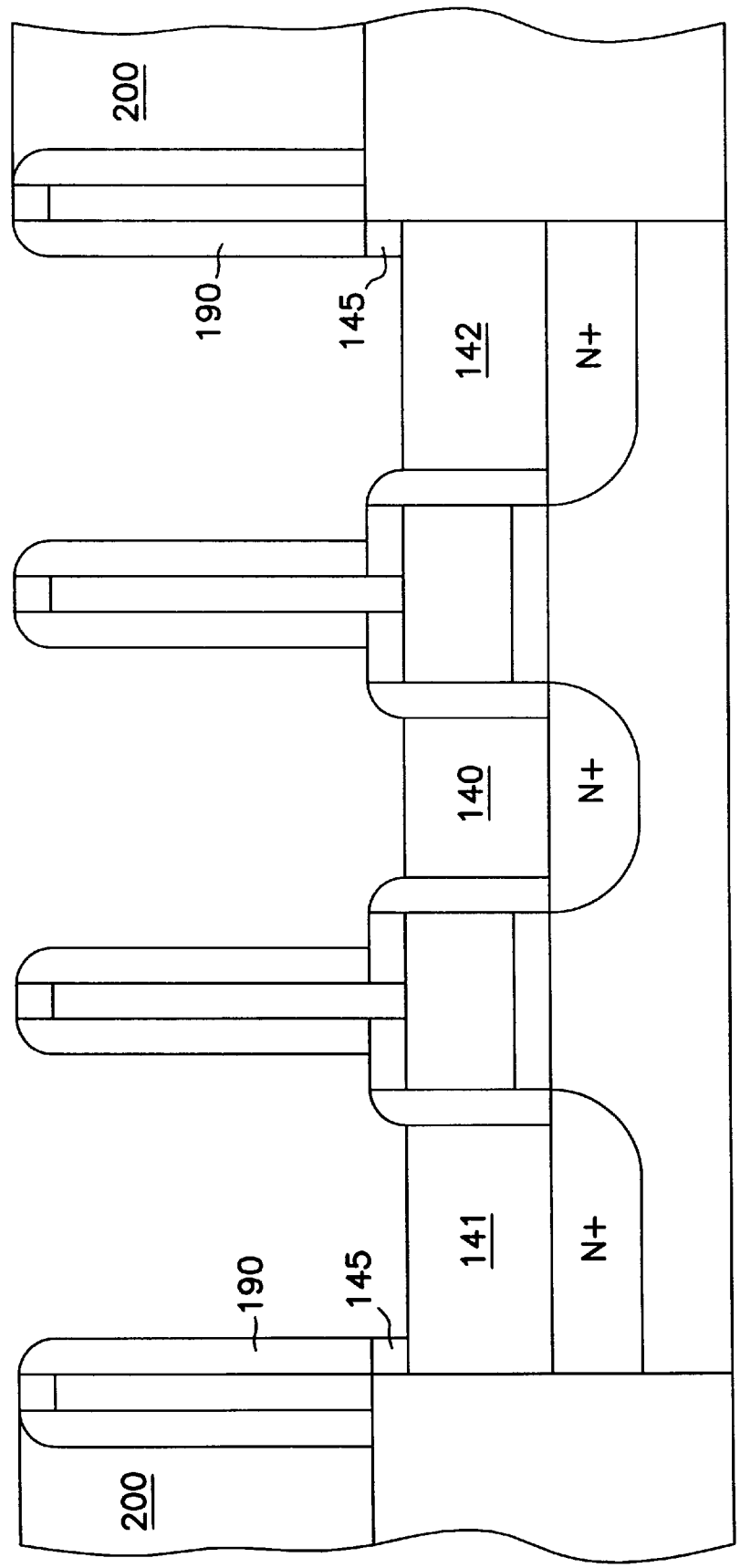

With the mask still present on the surface of the wafer, the exposed contact insulating layers 145 are etched. This step exposes contact regions 140. FIG. 6A illustrates how contact insulating layers 145 are etched and how small portions of contact insulating layers 145 remain between insulator 190 and contact regions 141 and 142. At this point, photoresist 270 is removed.

Figure 6B:
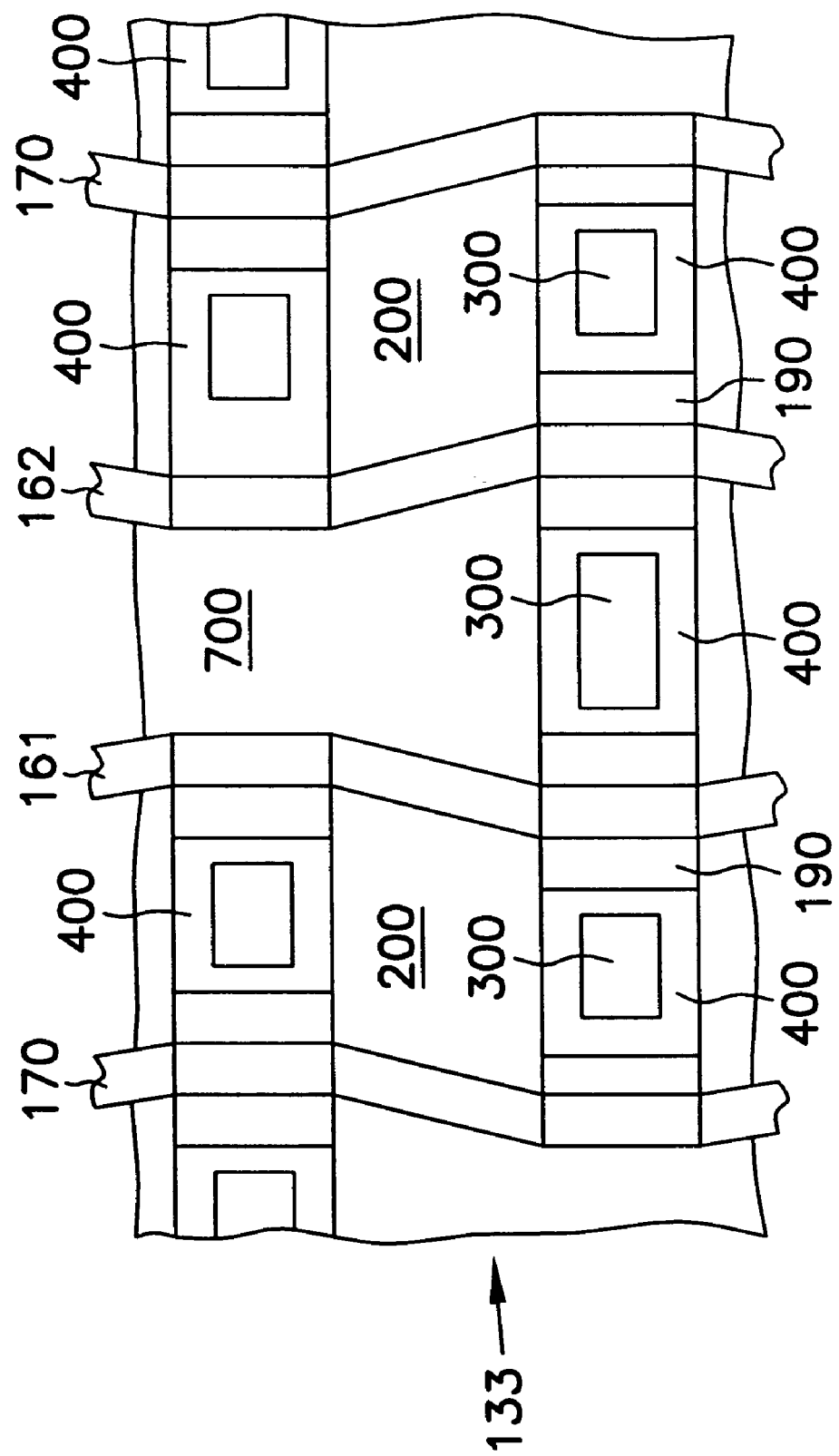

As illustrated in FIG. 6B, which is a top view of integrated circuit 133, after exposing contact regions 141 and 142, an insulator such as $SiO_2$ is CVD deposited on the walls of the openings between conductors 161 and 162 and passing conductors 170. This step creates insulating sleeve 400 which lines insulator 190 and intrinsic poly-silicon 200 but covers the recently exposed surfaces of contact regions 140, 141, and 142. The additional layer of insulation is advantageous because it reduces the size of the three stud holes 300 and reduces parasitic capacitances of conductive connections between the active regions of substrate 134 and the stacked capacitors which will be formed.

This deposition is followed by a directional (anisotropic) etch such as a dry reactive ion etch (RIE) which removes the recently deposited oxide from all horizontal surfaces but leaves it on the vertical surfaces. This removes the insulator from the recently exposed contact regions 140, 141, and 142.

It is necessary to correctly time the etch so that it does not inadvertently etch the horizontal oxide layers 195 which insulates the base of conductors 161 and 162 and device gates 138 and 139. As a result of the directional etch, the three stud holes 300 are lined with an insulating sleeve 400.

Figure 7A:
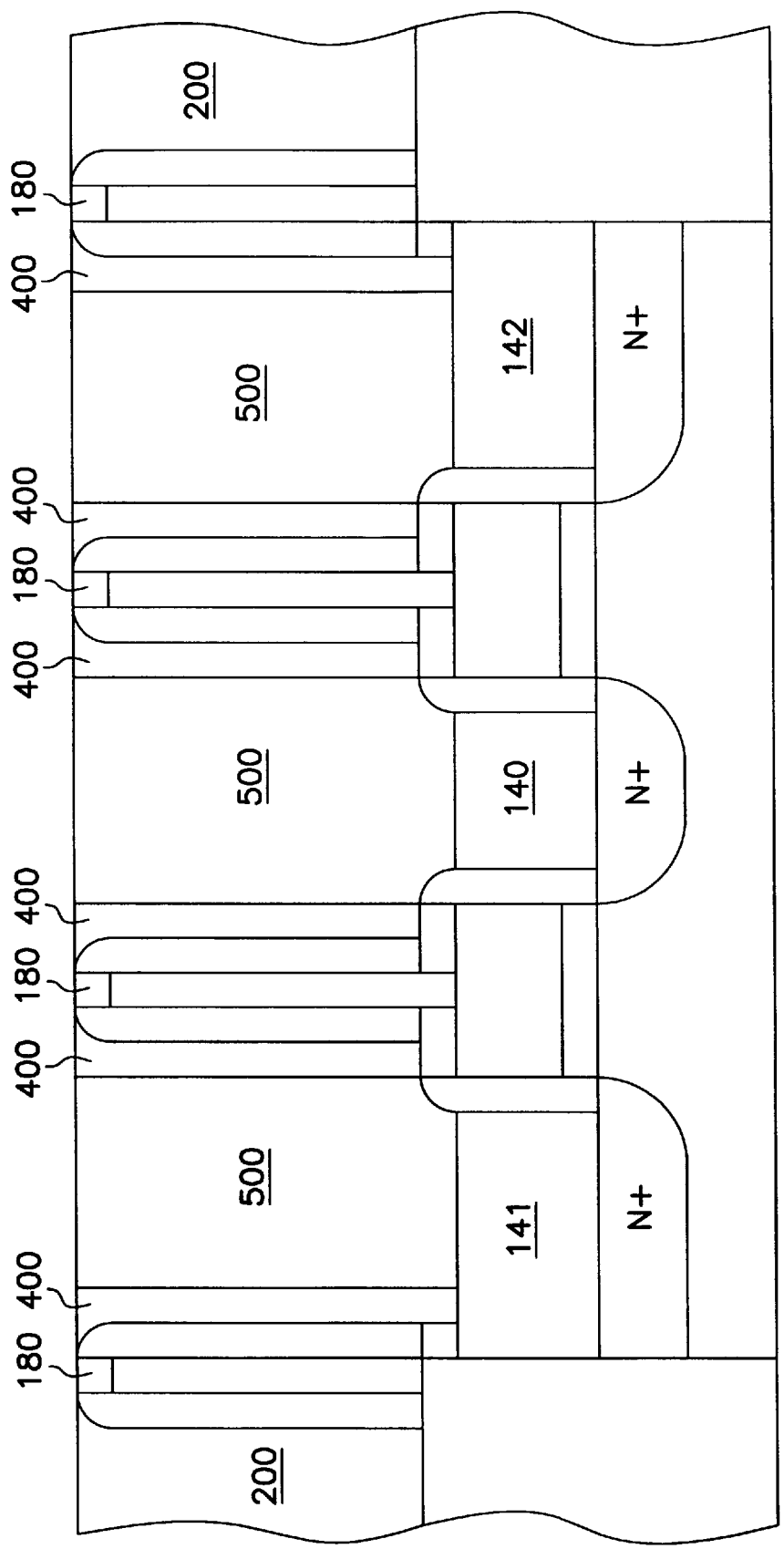

As illustrated in FIG. 7A, the next step in the process is to fill stud holes 300 with a conductive material such as doped poly-silicon 500 by conventional chemicalvapor deposition. Doped poly-silicon 500 is planarized so that it is flush with oxide caps 180 by chemical mechanical polishing (CMP). The doped poly-silicon 500 provides a conductive paths to contact regions 140, 141 and 142. In this manner, the conductive paths formed by doped poly-silicon 500 are bounded by conductors 161 and 162 and passing conductors 170.

Figure 7B:
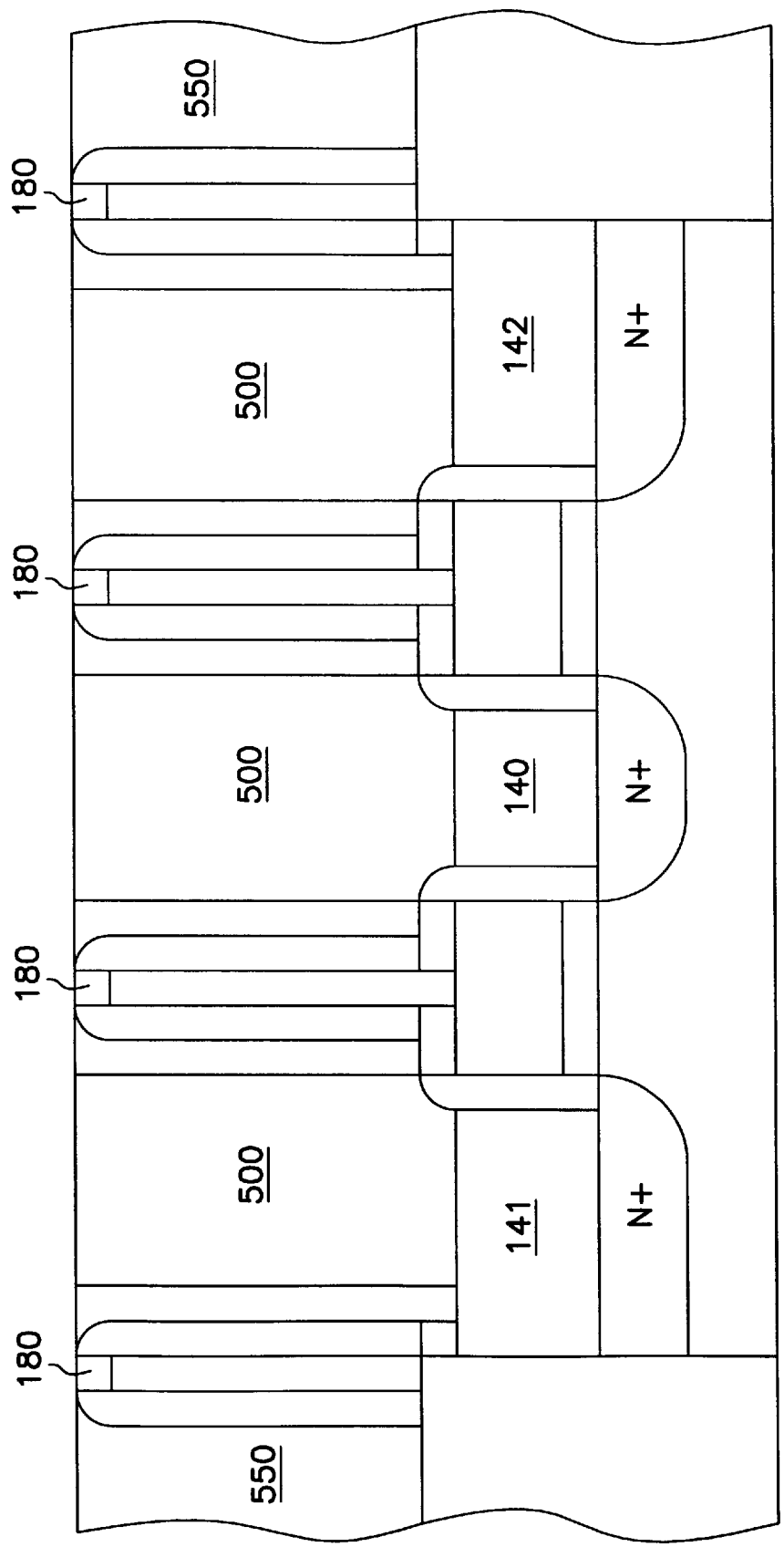

Next, as illustrated in FIG. 7B, the remaining portions of intrinsic poly-silicon 200, which were hidden by mask 270, are selectively etched. Insulator 550, which may be any conventional insulator such as $SiO_2$, is deposited on the entire wafer to fill the void regions in the wafer where intrinsic poly-silicon 200 was removed. Insulator 550 is then planarized by a conventional process so that the insulator is planar with oxide caps 180 and doped poly-silicon 500. The resulting formation is shown in FIG. 7B and is virtually identical to FIG. 7A with the exception that intrinsic poly-silicon 200 has been replaced with oxide filler 550.

At this point in the fabrication of the stacked capacitors, the process has effectively provided conductive paths between the sub-lithographic, edge-defamed word lines to the active regions of the substrate. The remaining steps in the process form the stacked capacitors.

Figure 8:
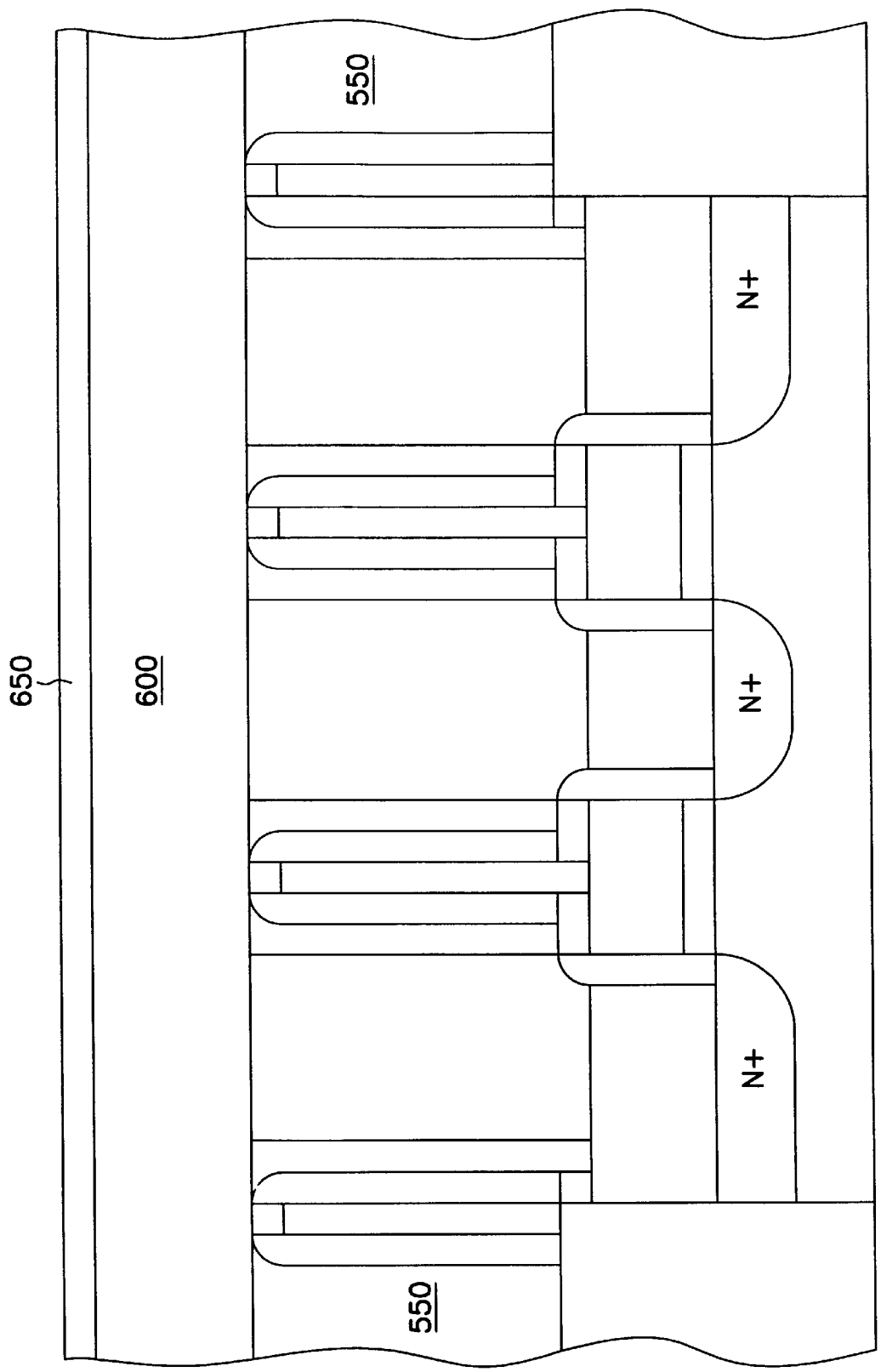

As illustrated in FIG. 8, a thick layer of intrinsic poly-silicon 600 is CVD deposited on the entire wafer. This layer should be at least 0.5 microns thick. Next, a thin mask 650 is created by depositing a conventional thin film insulator such as $Si_3N_4$ on the thick layer of intrinsic poly-silicon 600. The thin mask 650 should be approximately 500 angstroms thick.

Figure 9:
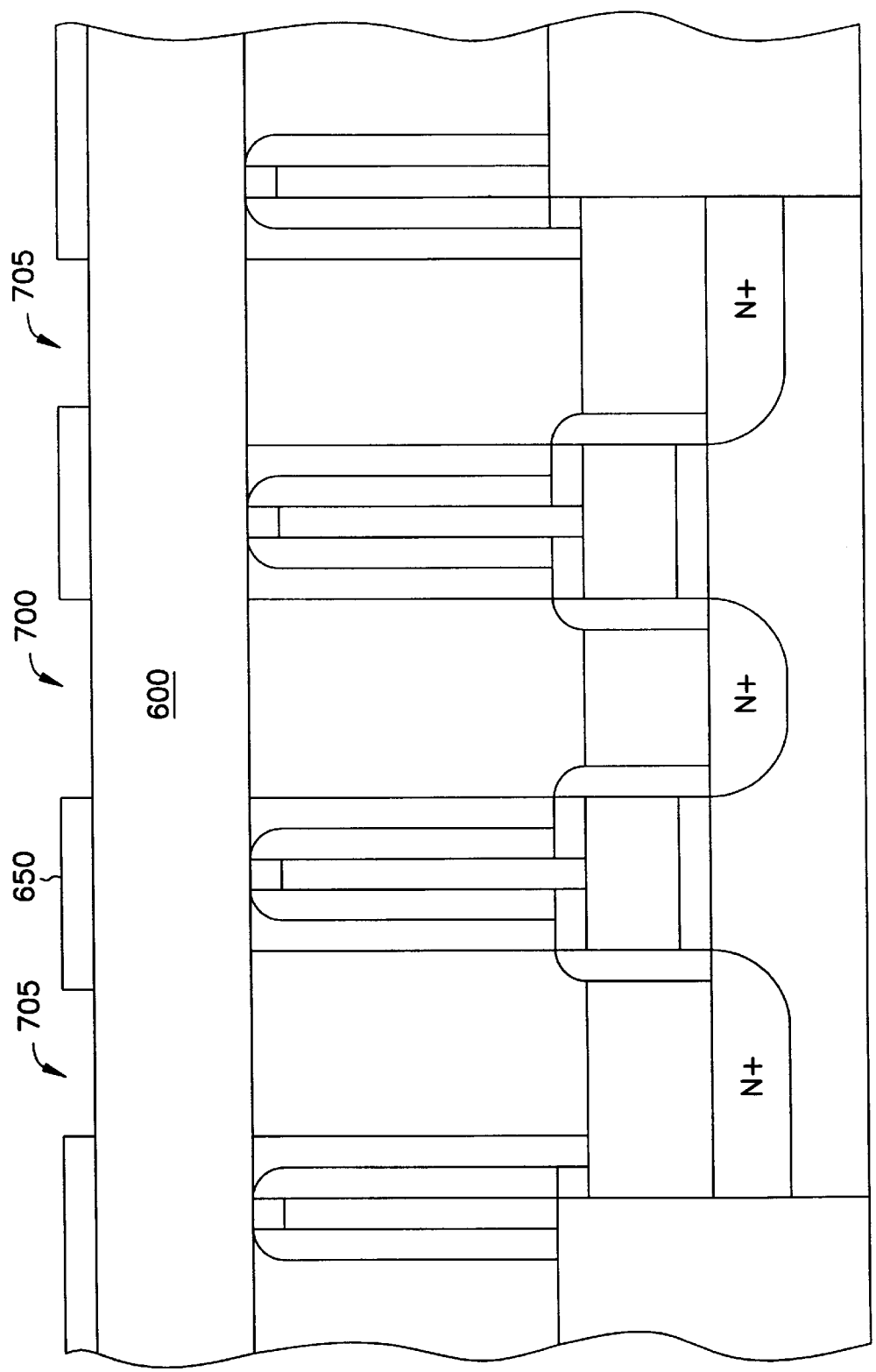

Next, a resist is applied to the wafer and is used to define openings over the doped poly-silicon 500. As illustrated in FIG. 9, three holes are etched in thin mask layer 650. The center hole 700 will ultimately be used for contacting the center region of doped silicon poly 500 and the outer holes 705 will be used to form stacked capacitors. Therefore, the sizes and shapes of outer holes 705 should be designed to maximize capacitor size and minimize contact size.

One advantageous feature of thin mask layer 650 is that it will function as a single mask image during the subsequent forming of the stacked capacitors and bit line contact. Specifically, thin mask layer 650 allows separate etching steps for a bit line contact and for the stacked capacitors, yet the formations will inherently be self-aligned because of thin mask layer 650. This feature allows for different etching techniques to be used for stacked capacitors and a bit line contact yet maintains their alignment.

Figure 10:
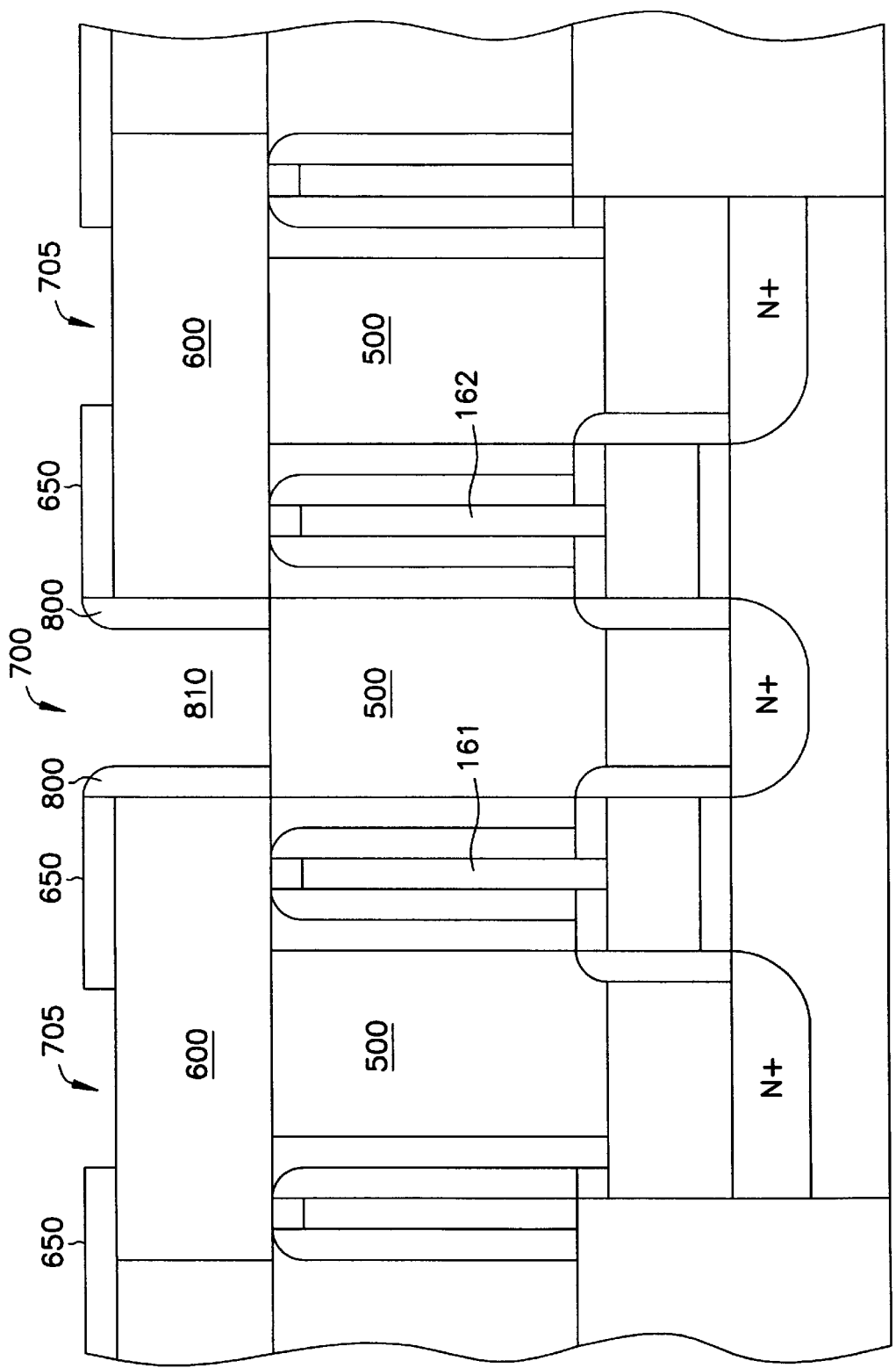

Referring to FIG. 10, after etching the thin mask layer 650, the resist is stripped and a new resist and mask is applied which only exposes center hole 700. Once the new mask is applied, a bit line contact hole 810 is created by anisotropically etching the exposed area of thick layer of intrinsic poly-silicon 600 to reveal the doped poly-silicon 500 between the two conductors 161 and 162. After etching the thick layer of intrinsic poly-silicon 600, an insulator such as $SiO_2$ is deposited and RIE etched to leave a bit line insulating liner 800 on the exposed wall of the intrinsic poly-silicon 600.

Figure 11:
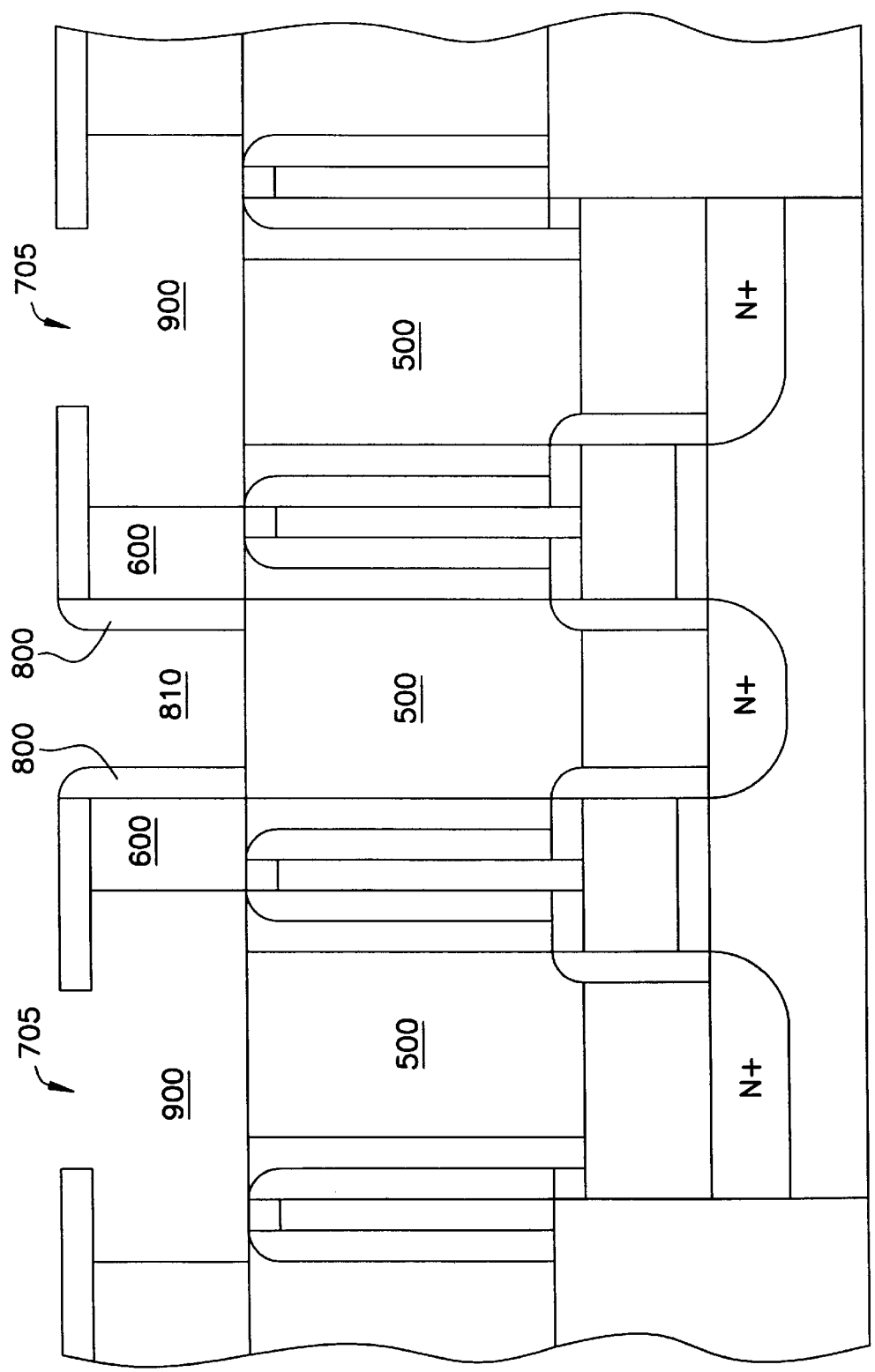

Next, the resist is stripped to expose outer holes 705 of thin film insulator 650. As illustrated in FIG. 11, intrinsic poly-silicon 600 is etched to create two node areas 900. During this step, the thin film insulator 650 acts as a mask so a new mask and resist need not be applied.

It is preferable that the etch have an isotropic component such that the etch is slightly nondirectional. The isotropic component effectively enlarges the size of node areas 900 relative to outer holes 705 in thin film insulator. After etching, the thin mask layer 650 is removed.

Figure 12:
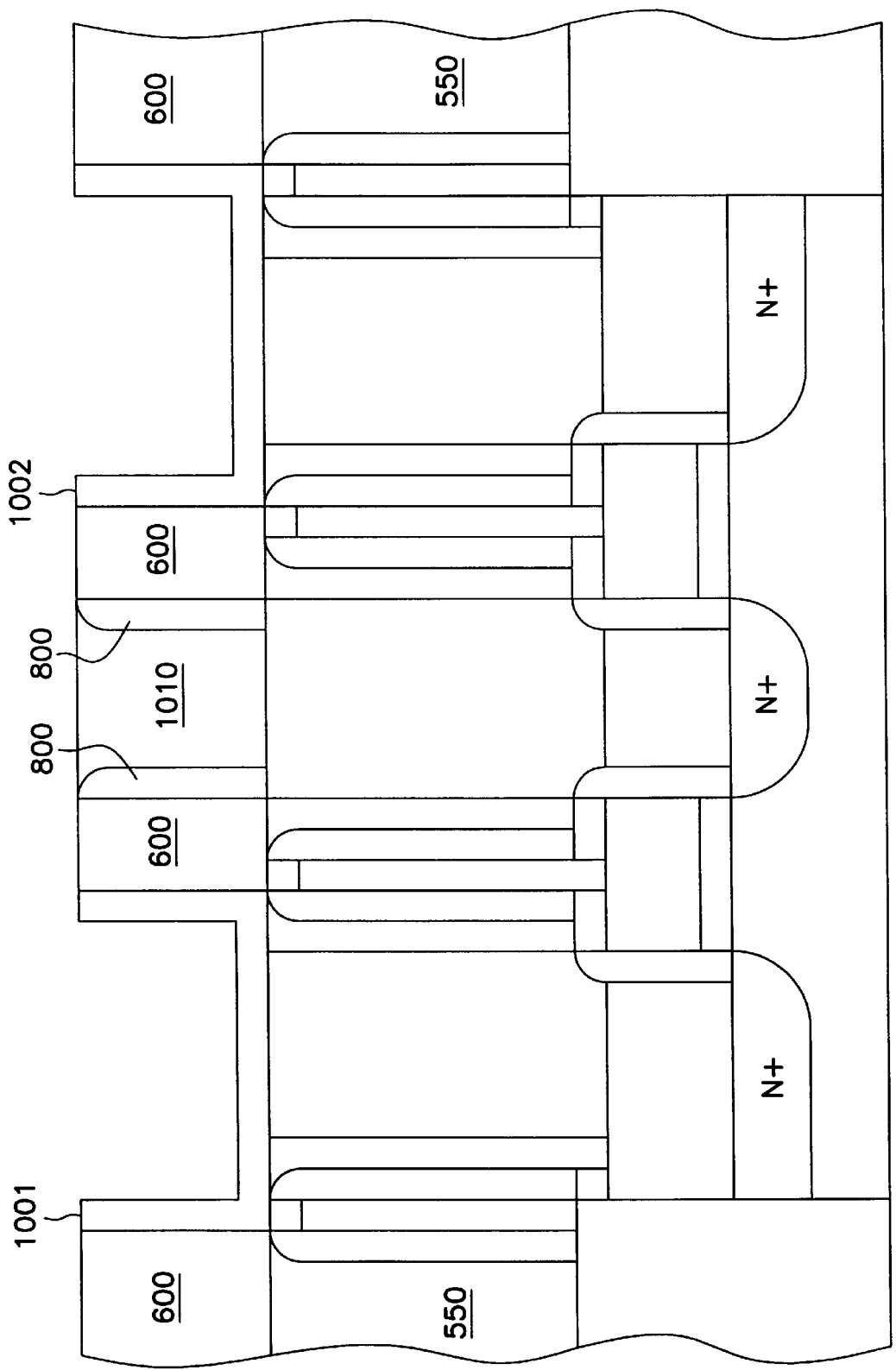

Referring to FIG. 12, a conductive material such as N+ poly-silicon is deposited on integrated circuit 133. Since bit line contact hole 810 is smaller than node areas 900, partly due to bit line insulating liner 800 and partly due the isotropic component, the N+ poly-silicon completely fills the first bit line contact hole 810 and forms a liner in the newly created node areas 900. Filling the first bit line contact hole 810 forms a bit line contact stud 1010. The layer of N+ poly-silicon which is deposited in the node areas 900 forms two storage plates 1001 and 1002; therefore, the thickness of the N+ poly-silicon should be only enough to guarantee filling the first bit line contact hole 810. After creating storage plates 1001 and 1002 and bit line contact stud 1010, the N+ poly-silicon is CMP polished in order to guarantee that storage plates 1001 and 1002 are separated from bit line contact stud 1010.

Figure 13:
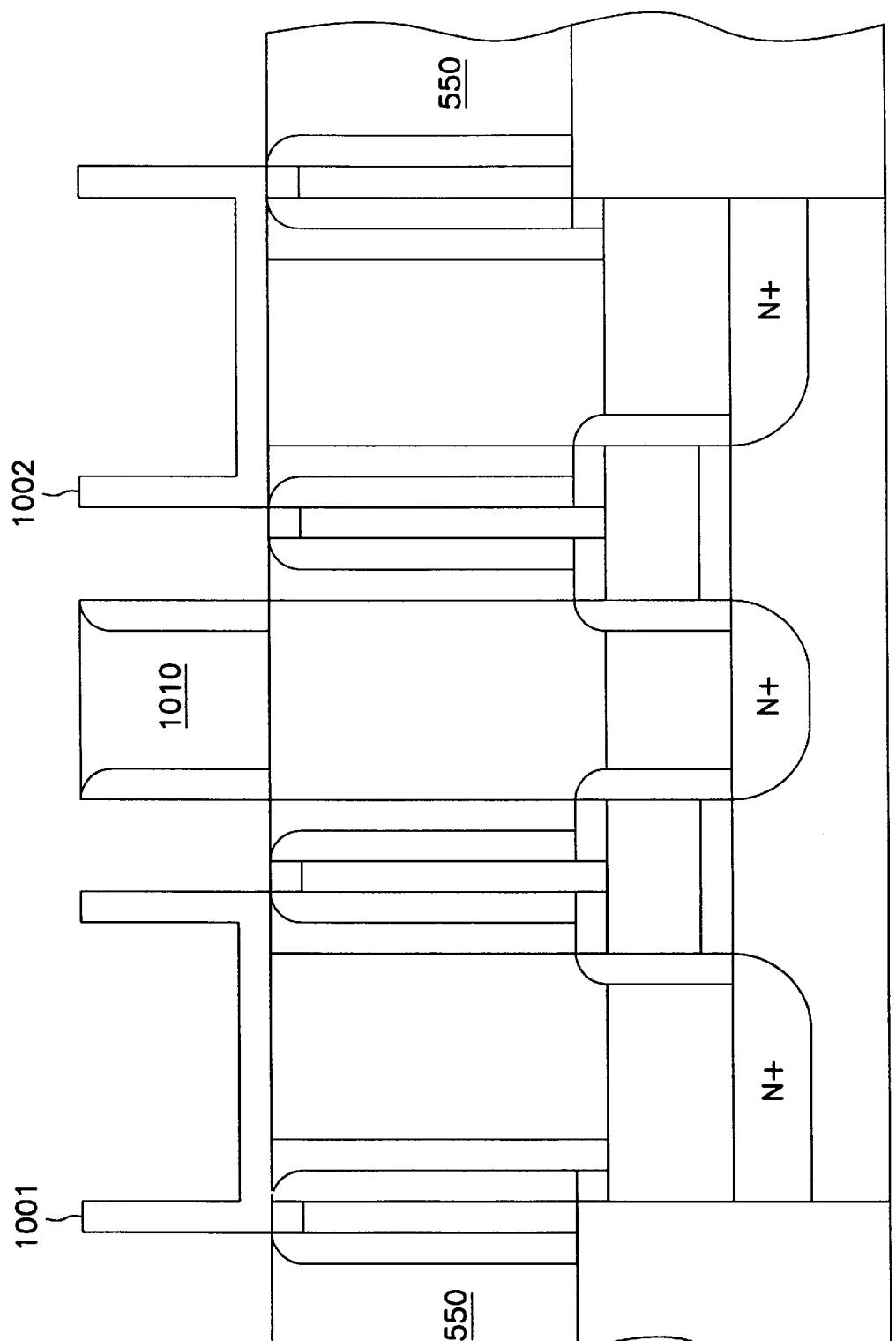

As illustrated in FIG. 13, the remaining intrinsic poly-silicon 600 is selectively etched after the N+ poly-silicon is planarized. This step produces openings in the isolation regions of the semiconductor wafer exposing the oxide filler 550.

Figure 14:
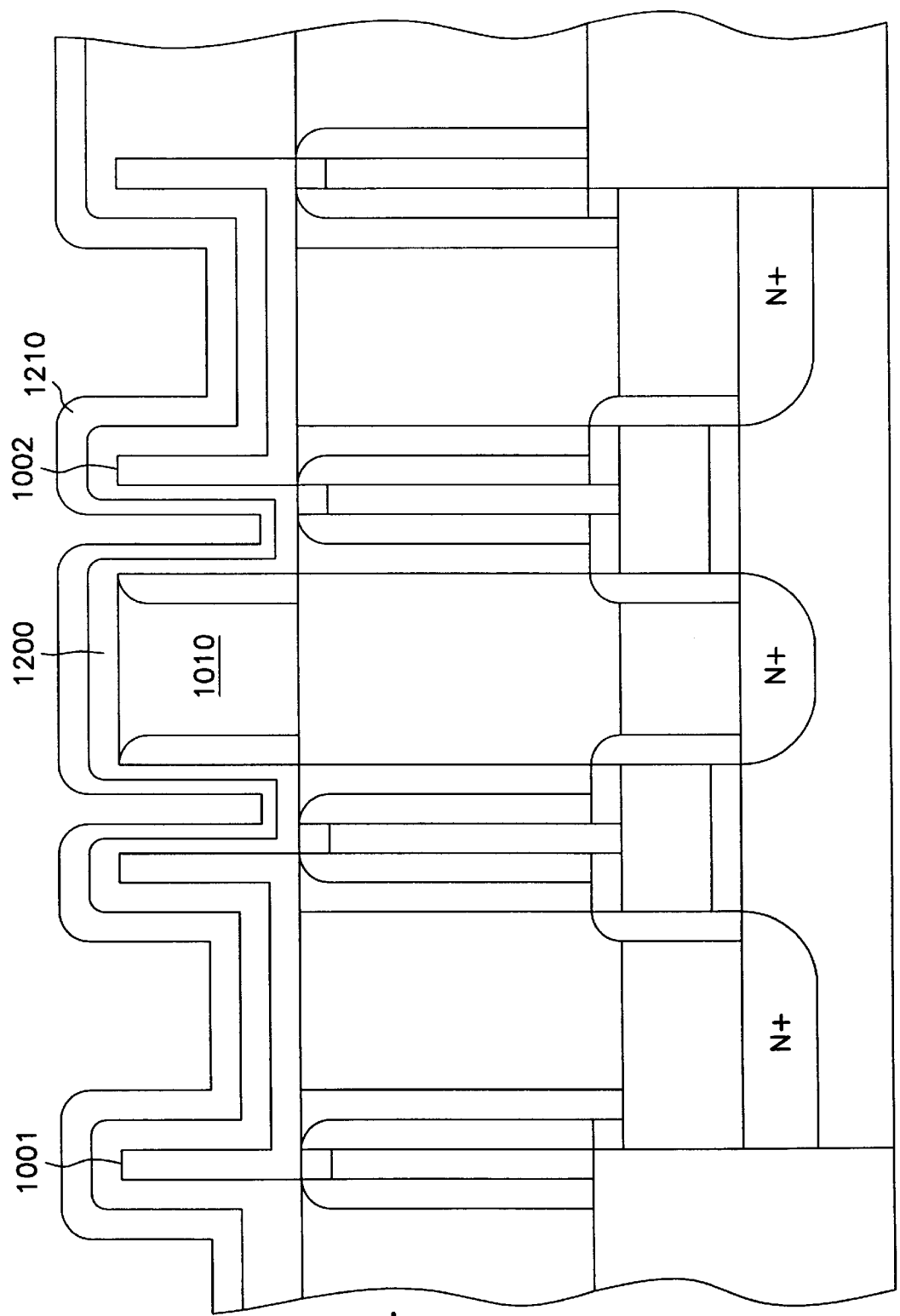

From this point, the inventive method follows conventional steps to form stacked capacitors outwardly from the storage plates 1000. Referring to FIG. 14, dielectric material 1200, which is any suitable dielectric material such as tantalum pentoxide, is deposited. In an alternate embodiment, any suitable dielectric material may be used. Next, the final plate conductor 1210 is deposited on the dielectric material 1200. In one embodiment, platinum is used as the final plate conductor 1210. In another embodiment, any suitable metallic conductor may be used.

Figure 15:
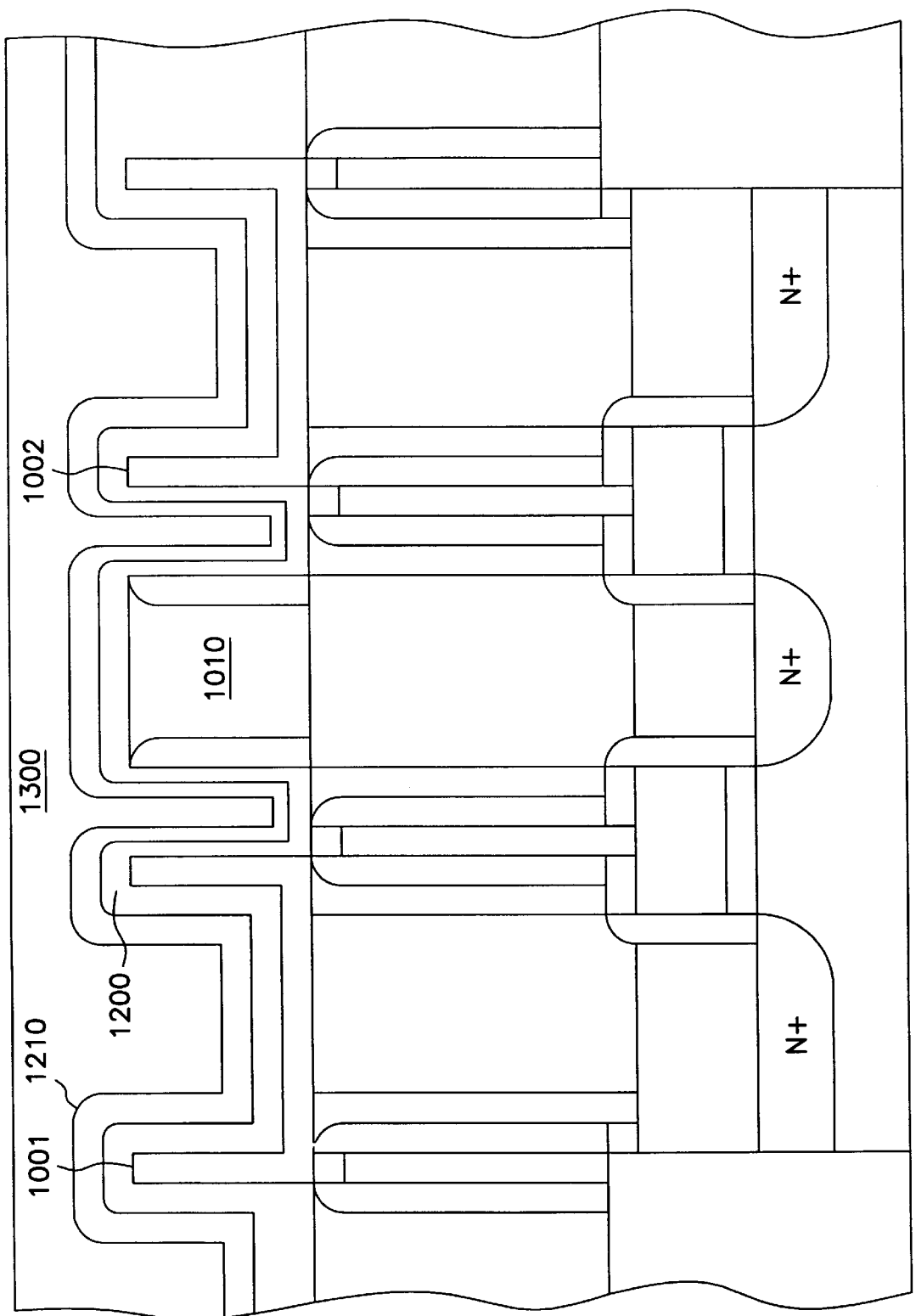

As illustrated in FIG. 15, planarizable insulator 1300, which is any suitable insulator such as $SiO_2$, is deposited after the necessary capacitor materials are formed. The insulator 1300 is planarized such that the surface is sufficiently smooth.

Figure 16:
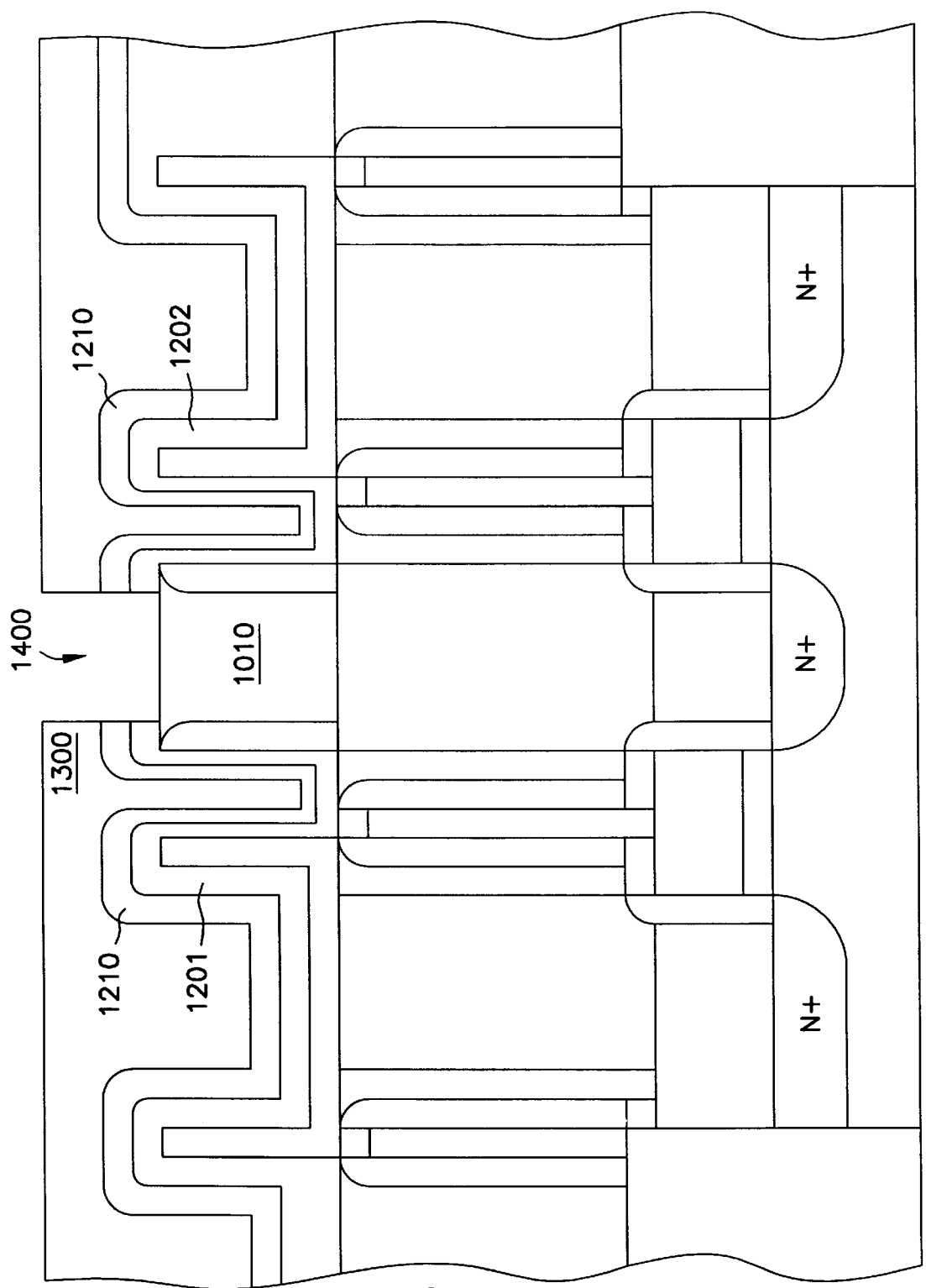

FIG. 16 illustrates a second bit line contact hole 1400 which is formed by applying a conventional contact mask and etching through planarizable insulator 1300, final plate conductor 1210, and through dielectric material 1200. In this manner, second bit line contact hole 1400 exposes bit line contact stud 1010.

Figure 17:
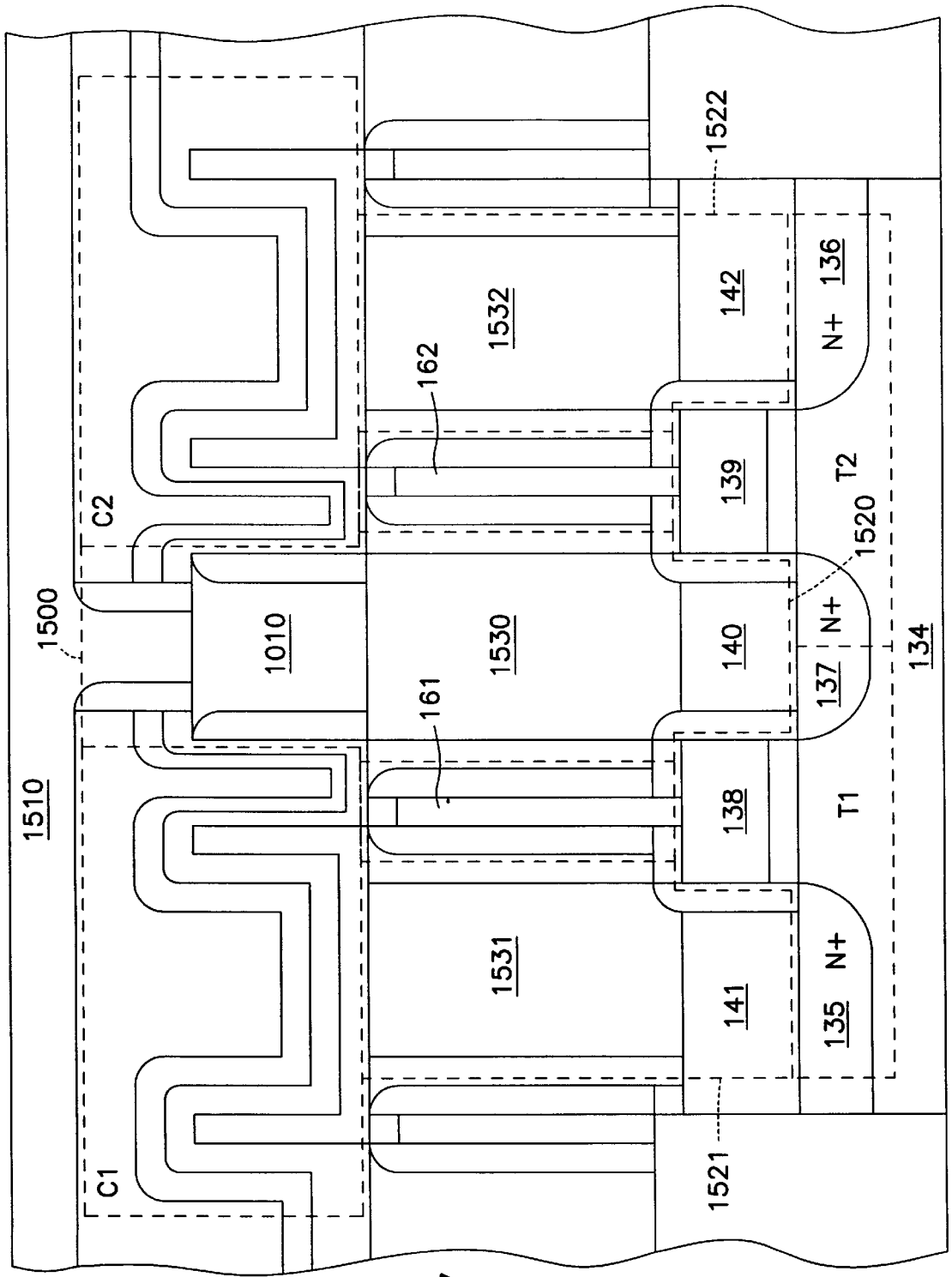

FIG. 17 illustrates the final configuration of the memory device. After forming second bit line contact hole 1400, a conformal insulator such as $SiO_2$ is deposited to create a bit line contact insulating liner 1500. This deposition is followed by an anisotropic etch which removes the recently deposited oxide from the exposed surface of bit line contact stud 1010 but leaves the oxide on the other surfaces. Finally, a metal is deposited and patterned to form bit line metal 1510.

As depicted in FIG. 17, the memory device comprises stacked capacitor C1 and stacked capacitor C2. The stacked capacitors C1 and C2 are accessed by transistors T1 and T2 respectively. Stacked capacitor C1 is coupled to transistor T1 by conductor 1521 which is adjacent to sub-lithographic, edge defined word line 161. Conductor 1521 comprises contact region 141 and doped poly-silicon 1531. Similarly, stacked capacitor C2 is coupled to transistor T2 by conductor 1522 which is adjacent to sub-lithographic, edge defined word line 162. Conductor 1522 comprises contact region 142 and doped poly-silicon 1532.

Retrieving data stored in stacked capacitors C1 and C2 is accomplished by bit line 1520 which comprises doped poly-silicon 1530, contact region 140, bit line contact stud 1010, and bit line metal 1510.

In an alternate embodiment, T1 and T2 may be any semiconductor device suitable for being outwardly formed from substrate 134. For example, in another embodiment, T1 and T2 may be diodes. Similarly, in another embodiment, stacked capacitors C1 and C2 may be any circuit element formed outwardly from word lines 161 and 162 and which is suitable for coupling to the first semiconductor device. For example, in an alternate embodiment, the circuit element may be a resistor, a diode, or a transistor.

Memory Device

Figure 18:
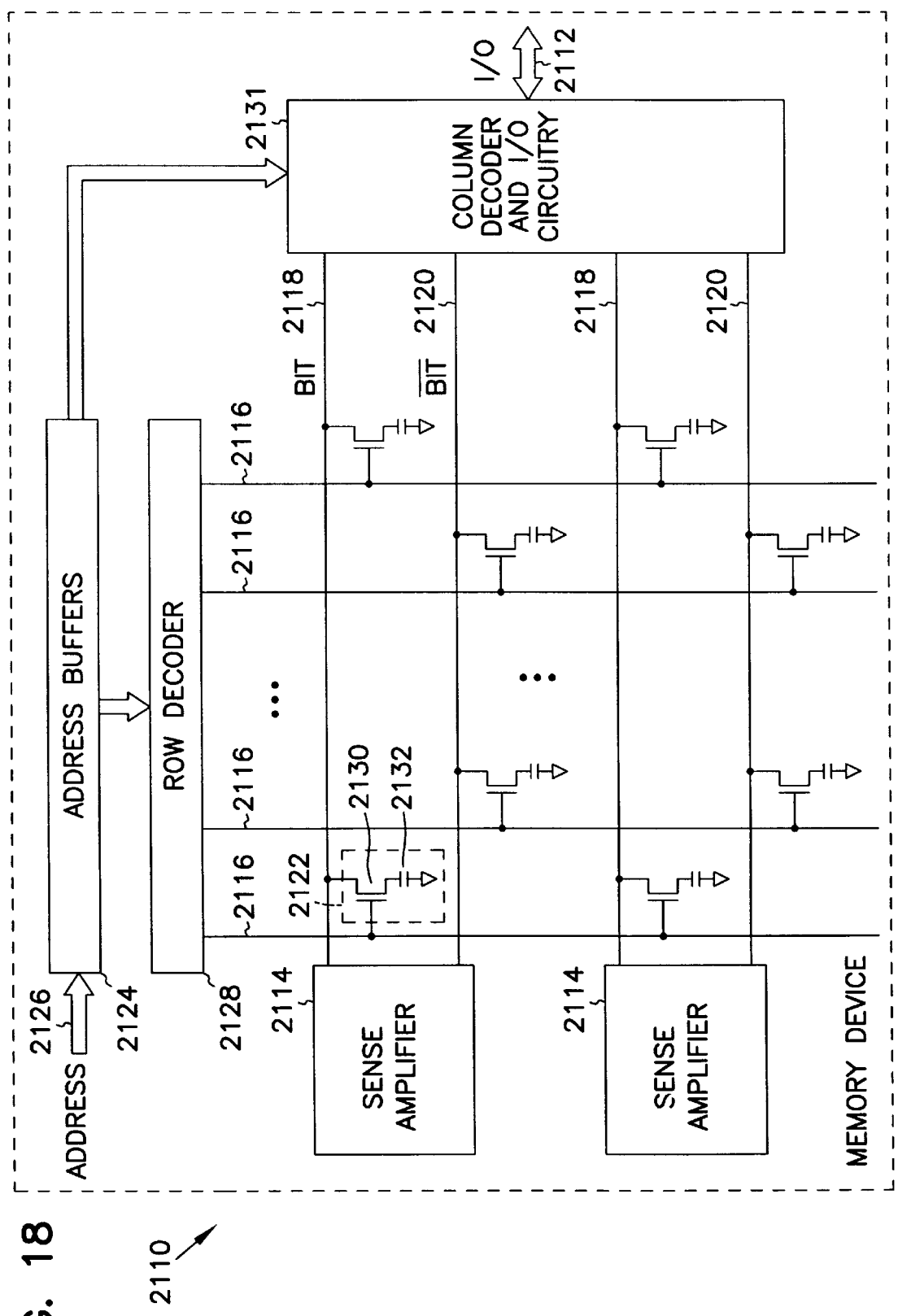
FIG. 18 is a schematic diagram of one embodiment of a memory device according to the teachings of the present invention.

FIG. 18 is a schematic diagram of a memory device, indicated generally at 2110. Memory device 2110 uses dual or folded digit lines to transfer data to and from memory cells via input/output (I/O) port 2112. Memory device 2110 includes word lines 2116, bit lines 2118, and bit complement lines 2120. A memory cell 2122 is coupled to each word line 2116 at the intersection with either a bit line 2118 or a bit complement line 2120. Sense amplifiers 2114 are coupled to a corresponding pair of bit line 2118 and bit complement line 2120. The operation of memory device 2110 is not tied to the folded digit line configuration shown in FIG. 2. Memory device 2110 may, alternatively, use an open digit line or other appropriate configuration for the array of memory cells that can be accessed through sense amplifiers 2114.

Memory device 2110 further includes circuitry that selects a memory cell 2122 from memory device 2110 to receive input or provide output to an external device such as a microprocessor (not shown) at I/O port 2112. Address buffers 2124 receive an address at input port 2126 from the external device. Address buffers 2124 are coupled to row decoder 2128 and column decoder 2131. Column decoder 2131 includes input-output circuitry that is coupled to an external device at I/O port 2112. Row decoder 2128 is coupled to word lines 2116. Column decoder 2131 is coupled to bit lines 2118 and bit complement lines 2120.

In operation, memory device 2110 receives an address of a selected cell at address buffers 2124. Address buffers 2124 identify a word line 2116 of a selected cell 2122 to row decoder 2128. Row decoder 2128 provides a voltage on word line 2116 to activate access transistors 2130 of each cell 2122 of the selected word line 2116. The charge on the capacitor 2132 is coupled to one of the bit lines 2118 or bit complement lines 2120. Sense amplifier 2114 senses a slight difference between the voltage on bit line 2118 and the voltage on bit complement line 2120 of the selected cell 2122 and drives bit line 2118 and bit complement line 2120 to the value of the power supply rails.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, a single gate segment 30 can be formed in each active region 12 rather than the two gate segments as shown and described. Further, the self-aligned gate segments can be used in applications other than DRAM devices. Further, gate segments 30 can be defined by techniques other than photolithography, such as x-ray or other appropriate technique. Gate segments 30 can also be used with world lines that are not of the edge-defined variety. Finally, trench capacitors can be used in place of the stacked capacitors shown and described in FIGS. 3 through 17.

What is claimed is:

1. A method for forming an integrated circuit, comprising:
   forming a shallow trench isolation region with a pad that extends outwardly from a layer of semiconductor material to isolate a plurality of active regions of the integrated circuit;
   removing the pad outwardly from the active regions;
   forming a thin insulating layer outwardly from the active regions;
   forming a conductive layer outwardly from the insulating layer;
   planarizing the conductive layer such that a working surface of the conductive layer is substantially coplanar with a surface of the shallow trench isolation region;
   selectively removing portions of the conductive layer and the insulating layer from the active regions to form at least one gate segment in each active region;
   forming source/drain regions in the portions of the active regions not covered by the conductive layer; and
   selectively interconnecting the active regions with conductors that pass outwardly from the gate segments and the shallow trench isolation region to form the integrated circuit.

2. The method of claim 1, wherein interconnecting the active regions comprises:
   forming a number of edge-defined word lines that selectively interconnect the gate segments to form an array of memory cells;
   coupling a bit line to a source/drain region of each memory cell; and
   coupling at least one storage capacitor to a source/drain region for each memory cell.

3. The method of claim 1, wherein forming at least one gate segment comprises forming two gate segments in each active region.

4. The method of claim 1, wherein selectively interconnecting the active regions comprises selectively interconnecting the active regions with edge-defined conductors.

5. A method for forming a memory device, comprising:
   forming a shallow trench isolation region with a pad that extends outwardly from active regions of a semiconductor material;
   removing the pad outwardly from the active regions;
   forming a thin insulating layer outwardly from the active regions;
   forming a conductive layer outwardly from the insulating layer;
   planarizing the conductive layer such that a working surface of the conductive layer is substantially coplanar with a surface of the shallow trench isolation region;
   selectively removing portions of the conductive layer and the insulating layer from the active regions to form at least one gate segment in each active region;
   forming source/drain regions in the portions of the active regions not covered by the conductive layer;

interconnecting the gate segments with word lines; and selectively coupling bit lines and storage capacitors to the source/drain regions to form an array of cells for the memory device.

6. The method of claim 5, wherein forming a conductive layer comprises depositing a poly-silicon layer.

7. The method of claim 5, wherein interconnecting the gate segments comprises interconnecting the gate segments to form a folded bit line array of memory cells.

8. The method claim 5, wherein forming the shallow trench isolation region comprises:

etching a trench in the layer of semiconductor material to isolate a number of active regions;

forming an oxide layer that fills the trench; and planarizing a working surface of the oxide layer.

9. The method of claim 5, wherein interconnecting the gate segments with word lines comprises interconnecting the gate segments with edge-defined word lines.

* * * * *

UNITED STATES PATENT AND TRADEMARK OFFICE
CERTIFICATE OF CORRECTION

PATENT NO.: 5,976,930
DATED: Nov. 2, 1999
INVENTOR(S): Noble

It is certified that error appears in the above-identified patent and that said Letters Patent is hereby corrected as shown below:

In column 3, line 49, delete "confme" and insert --confine--, therefor.

In column 4, line 34, delete "FIG.5 1A" and insert --FIGS. 1A--, therefor.

In column 7, line 29, delete "edge-defamed" and insert --edge defined--, therefor.

Signed and Sealed this

Fifteenth Day of May, 2001

Attest:

NICHOLAS P. GODICI

Attesting Officer     Acting Director of the United States Patent and Trademark Office